United States Patent
Lee et al.

(10) Patent No.: US 10,396,263 B2
(45) Date of Patent: Aug. 27, 2019

(54) THERMOELECTRIC POWDER AND THERMOELECTRIC MATERIAL PREPARED USING THE SAME

(71) Applicant: LG CHEM, LTD., Seoul (KR)

(72) Inventors: Jae-Ki Lee, Daejeon (KR); Tae-Hoon Kim, Daejeon (KR); Cheol-Hee Park, Daejeon (KR); Kyung-Moon Ko, Daejeon (KR); Chee-Sung Park, Daejeon (KR); Myung-Jin Jung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 13 days.

(21) Appl. No.: 15/537,339

(22) PCT Filed: Dec. 16, 2015

(86) PCT No.: PCT/KR2015/013819
§ 371 (c)(1),
(2) Date: Jun. 16, 2017

(87) PCT Pub. No.: WO2016/099155
PCT Pub. Date: Jun. 23, 2016

(65) Prior Publication Data
US 2018/0269368 A1  Sep. 20, 2018

(30) Foreign Application Priority Data

Dec. 16, 2014 (KR) .................. 10-2014-0181777
Dec. 16, 2014 (KR) .................. 10-2014-0181778

(51) Int. Cl.
*H01L 35/18* (2006.01)
*H01L 35/28* (2006.01)
(Continued)

(52) U.S. Cl.
CPC .............. *H01L 35/18* (2013.01); *H01L 35/28* (2013.01); *H01L 35/32* (2013.01); *H01L 35/34* (2013.01)

(58) Field of Classification Search
None
See application file for complete search history.

(56) References Cited

U.S. PATENT DOCUMENTS

2010/0288967 A1*  11/2010  Subramanian ....... C01G 51/006
                                                          252/71
2012/0114961 A1    5/2012  Lee et al.
2012/0292575 A1   11/2012  Murai et al.

FOREIGN PATENT DOCUMENTS

KR    10-2012-0027187 A    3/2012
KR    10-2012-0036587 A    4/2012
(Continued)

OTHER PUBLICATIONS

Fu, "Enhancement of thermoelectric properties of Yb filled skutterudites by an Ni-Induced "core-shell" structure", J. Mater. Chem. A, vol. 3, 1010-1016, pub. Nov. 5, 2014.*
(Continued)

*Primary Examiner* — Devina Pillay

(57) ABSTRACT

Disclosed is surface-treated thermoelectric powder which may be used for manufacturing a Skutterudite-based thermoelectric material with improved thermoelectric performance. The thermoelectric powder may include a core portion having one or more Skutterudite particles, and a coating portion having a Ni-containing material and coated on at least a part of a surface of the core portion.

13 Claims, 25 Drawing Sheets

(51) Int. Cl.
    H01L 35/32    (2006.01)
    H01L 35/34    (2006.01)

(56) References Cited

FOREIGN PATENT DOCUMENTS

| KR | 10-2013-0084120 A | 7/2013 |
| WO | WO 2010/115776 A1 | 10/2010 |
| WO | WO 2010/146459 A2 | 12/2010 |
| WO | WO 2011/014479 A1 | 2/2011 |

OTHER PUBLICATIONS

Kitigawa, "Temperature dependence of thermoelectric properties of Ni-doped CoSb3", Journal of Physics and Chemistry of Solids 66 (2005) 1635-1639.*
Da Ros, Thermoelectric Properties of InxCo4-yNiySb12 Skutterudite Compounds, Mater. Res. Soc. Symp. Proc. vol. 1044, 2008 Materials Research Society, 1044-U05-06, pp. 1-6 (Year: 2008).*
International Search Report for International Patent Application No. PCT/KR2015/013819 filed on Dec. 16, 2015.
Il-Ho Kim et al., "Thermoelectric Properties of Doped CoSb3 Prepared by Vacuum Induction Melting", Thermoelectrics, 2005, ICT 2005.24th International Conference on Clemsen, Jun. 19, 2005, pp. 118-120, IEEE.
Extended European Search Report for Application No. 15870322.3, dated Jun. 29, 2018.

* cited by examiner

THERMOELECTRIC POWDER AND THERMOELECTRIC MATERIAL PREPARED USING THE SAME

TECHNICAL FIELD

The present application is a U.S. National Stage of International Patent Application No. PCT/KR2015/013819 filed on Dec. 16, 2015, which claims priority to Korean Patent Application Nos. 10-2014-0181777 and 10-2014-0181778 filed on Dec. 16, 2014 in the Republic of Korea, the disclosures of which are incorporated herein by reference.

The present disclosure relates to a thermoelectric conversion technique, and more particularly, to a technique capable of improving thermoelectric conversion characteristics of Skutterudite-based thermoelectric conversion materials.

BACKGROUND ART

A compound semiconductor is a compound operating as a semiconductor by combining two or more elements, not a single element such as silicon or germanium. Various kinds of compound semiconductors have been developed and used in various fields. For example, a compound semiconductor may be used for a solar cell and a light emitting element such as a light emitting diode or a laser diode using a photoelectric conversion or a photoelectric conversion element using a Peltier effect.

In particular, the thermoelectric conversion element may be applied for a thermoelectric conversion power generation or a thermoelectric conversion cooling. In general, an N-type thermoelectric semiconductor and a P-type thermoelectric semiconductor are electrically connected in series and thermally connected in parallel. Among them, for the thermoelectric conversion power generation, thermal energy is converted into electric energy by using thermoelectric power generated by applying a temperature difference to the thermoelectric conversion element. In addition, for the thermoelectric conversion cooling, electrical energy is converted into heat energy by utilizing a temperature difference at both ends of the thermoelectric conversion element when DC current flows to both ends of the thermoelectric conversion element.

This thermoelectric technology has an advantage in that heat and electricity may be converted into each other directly and reversibly without using a heat-resistant engine. In particular, as the interest in environment-friendly energy materials has grown recently, the thermoelectric technology is gradually spotlighted as a notable technology.

The energy conversion efficiency of the thermoelectric conversion element is generally dependent on a ZT value which is a performance index of the thermoelectric conversion material. Here, ZT may be determined according to a Seebeck coefficient, electrical conductivity and thermal conductivity, and the higher the ZT value, the better the performance of the thermoelectric conversion material.

Many thermoelectric materials have been proposed and developed for use as thermoelectric conversion elements. Representative groups include chalcogenide series, antimonide series, clathrate series, Half Heusler series, Skutterudite series, and the like.

In the existing technique, the development of thermoelectric materials has been progressing in the direction of improving the characteristics mainly by selecting additives or optimizing the composition, or by implementing a fine lattice utilizing a nanostructure. However, these research directions have a limit in applying the concept of phonon glass and electron crystal, and there are limitations such as lack of reproducibility or difficulty in implementation from an industrial viewpoint.

DISCLOSURE

Technical Problem

Therefore, the present disclosure is designed to solve the problems of the related art, and therefore the present disclosure is directed to providing a thermoelectric material with improved thermoelectric conversion performance by using surface-treated thermoelectric powder.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided thermoelectric powder, comprising: a core portion having one or more Skutterudite particles; and a coating portion having a Ni-containing material and coated on at least a part of a surface of the core portion.

Here, the Ni-containing material may include at least one of a Ni single substance and a Ni compound.

In addition, the Ni compound may include at least one of In, Sb and Co, along with Ni.

In addition, the Ni compound may include $Ni_{1-x}Co_xSb$, where x may satisfy $0 \leq x < 1$.

In addition, the coating portion may further include at least one of In, Sb, Co, O, C and Cl, or a compound thereof.

In addition, the coating portion may include at least one of InSb, $In_2O_3$ and carbon.

In addition, the core portion may have an average particle size of 1 nanometer to 100 micrometer, and the coating portion may have a thickness of 0.1 nanometer to 10 micrometer.

In addition, the thermoelectric powder according to present disclosure may further comprise fine particles having a particle size smaller than the particles of the core portion.

In addition, the fine particles may include at least one of Ni, In, Sb, Co, O, C and Cl, or a compound thereof.

In addition, the thermoelectric powder according to the present disclosure may further include a pore in the core portion or the coating portion.

In another aspect of the present disclosure, there is also provided thermoelectric material, comprising: a plurality of Skutterudite grains including at least one kind of Skutterudite material; and a Ni-containing material located at a grain boundary between the plurality of Skutterudite grains.

Here, the Ni-containing material may include $Ni_{1-x}Co_xSb$, where, x may satisfy $0 \leq x < 1$.

In addition, at least one of InSb, $In_2O_3$ and carbon may be located at the grain boundary.

In addition, the thermoelectric material according to the present disclosure may further comprise fine grains located in at least one of a surface, an interior and a boundary of the Skutterudite grain, having a smaller size than the Skutterudite grain, and including at least one of Ni, In, Sb, Co, O, C and Cl, or a compound thereof.

In addition, the fine grain may be formed in a lamella structure.

In another aspect of the present disclosure, there is also provided a thermoelectric conversion element, comprising the thermoelectric material according to the present disclosure.

In another aspect of the present disclosure, there is also provided a thermoelectric power generation apparatus, comprising the thermoelectric material according to the present disclosure.

Advantageous Effects

According to the present disclosure, a thermoelectric powder with excellent thermoelectric conversion performance may be provided.

In particular, according to an embodiment of the present disclosure, a Ni-coated thermoelectric powder having a different phase from a base material may be provided by surface-treating a Skutterudite material with Ni or a Ni compound.

If a thermoelectric material is manufactured using the Ni-coated thermoelectric powder, a Skutterudite-based thermoelectric material having improved thermoelectric conversion characteristics may be obtained.

In particular, if a thermoelectric material is manufactured by sintering the thermoelectric powder according to the present disclosure, the Ni-containing material may be included at a grain boundary. In addition, the thermoelectric material prepared using the thermoelectric powder of the present disclosure may include InSb at the grain boundary and $In_2O_3$ in the grain. In addition, the thermoelectric material prepared using the thermoelectric powder of the present disclosure may have regions containing a secondary phase, or a secondary phase and a pore, at an inter-boundary of the $CoSb_3$ grain.

These various elements of the present disclosure may lead to phonon scattering, further lowering the lattice thermal conductivity of the thermoelectric material. Therefore, the thermoelectric material according to the present disclosure may ensure a high ZT value.

Therefore, according to this embodiment of the present disclosure, a thermoelectric material with improved thermoelectric conversion performance may be easily obtained.

Moreover, the thermoelectric material prepared using the thermoelectric powder according to the present disclosure may maintain a higher ZT value over a wide temperature range below 600° C. in comparison to the existing thermoelectric material. Accordingly, the thermoelectric material according to the present disclosure may ensure stable thermoelectric conversion performance for materials exposed to the temperature range.

In addition, the thermoelectric powder according to the present disclosure may be used for a solar cell, an infrared (IR) window, an IR sensor, a magnetic device, a memory, and the like.

In addition, the thermoelectric powder according to an embodiment of the present disclosure may be easily applied to industries due to excellent reproducibility.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
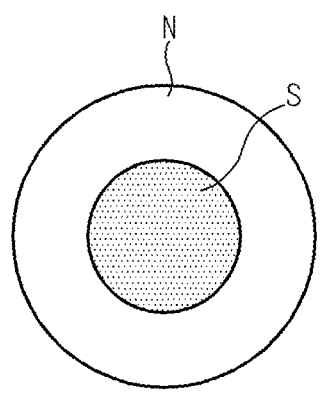
FIG. 1 is a schematic diagram showing thermoelectric powder according to an embodiment of the present disclosure.

FIG. 1 is a schematic diagram showing thermoelectric powder according to an embodiment of the present disclosure.

Referring to FIG. 1, thermoelectric powder according to the present disclosure may include a core portion as denoted by S and a coating portion as denoted by N.

The core portion may include a Skutterudite material. Various Skutterudite-based materials may be employed as the material of the core portion.

The core portion may include one or more Skutterudite particles. In particular, the core portion may be made of $CoSb_3$-based Skutterudite material. At this time, the $CoSb_3$-based Skutterudite material may further include other elements besides Co and Sb.

For example, the core portion may further include In along with Co and Sb. At this time, In may be contained to be filled in a pore in a unit lattice. In this case, the Skutterudite core portion may be expressed by a composition formula such as $In_xCo_4Sb_{12}$. Here, x may be 0 to 1, for example.

In addition, the core portion may further include other metals besides In. For example, the material constituting the core portion may further include at least one element selected from Ca, Sr, Ba, Ti, V, Cr, Mn, Cu, Zn, Pd, Ag, Cd, Sc, Y, La, Ce, Pr, Nd, Sm, Eu, Gd, Tb, Dy, Ho, Er, Tm, Yb and Lu. In this case, the material constituting the core portion may be expressed by a composition formula such as $In_xM_yCo_4Sb_{12}$. Here, M may mean various metals further added as above, like Ca and Sr, and y may be 0 to 1.

As another example, the core portion may be configured such that at least a part of Co sites or at least a part of Sb sites is substituted with another element. For example, a part of Co may be substituted with at least one of Fe, Ni, Ru, Rh, Pd, Ir and Pt. As another example, a part of Sb may be substituted with at least one of O, S, Se, Te, Sn and In. In this case, the material constituting the core portion may be expressed by a composition formula such as $In_xCo_{4-a}A_aSb_{12-b}Q_b$. Here, A means a Co-substituting element such as Fe and Ni, and Q means an Sb-substituting element such as O, S, Se, Te, Sn, and In. In addition, for example, a may be 0 to 1, and b may be 0 to 4.

In addition, the Skutterudite material constituting the core portion may employ other Skutterudite materials such as Fe—Sb series, Co—Fe—Sb series, Co—Ni—Sb series and Co—As series, besides Co—Sb series, and the present disclosure is not limited to a Skutterudite material of a specific composition.

The core portion may be made of particles of this Skutterudite material. For example, the core portion may be made of In—Co—Sb-based particles.

The coating portion may be present in a coated form on the surface of the core portion. That is, in the case of the thermoelectric powder according to the present disclosure, the coating portion may be located on the surface of the core portion to surround the outside of the core portion.

The coating portion may be made of a different kind of material from the core portion, which is a base material.

In particular, the coating portion may include a Ni-containing material. Here, the Ni-containing material is a material containing at least Ni and may be a Ni single substance composed only of Ni single elements or a Ni compound formed by combining Ni elements with another element. In addition, the Ni-containing material may be a material containing both the Ni single substance and the Ni compound.

Preferably, the Ni compound, which may be included in the coating portion, may be configured to further include at least one of In, Sb and Co together with Ni.

For example, the Ni compound may include at least one of NiSb and $Ni_{1-x}Co_xSb$ (here, 0<x<1). In this case, a Ni and Sb compound such as NiSb or a Ni, Co and Sb compound may be included in the coating portion which surrounds the core portion made of $CoSb_3$.

Meanwhile, the core portion may have a spherical shape as shown in FIG. 1. However, the present disclosure is not limited to this shape.

Figure 2:
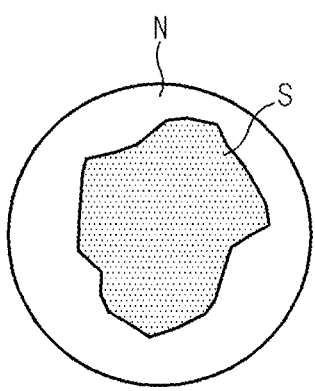
FIG. 2 is a schematic diagram showing thermoelectric powder according to another embodiment of the present disclosure.

FIG. 2 is a schematic diagram showing thermoelectric powder according to another embodiment of the present disclosure.

Referring to FIG. 2, the core portion S may be formed in an amorphous shape. That is, even though the core portion is configured to have a fixed shape in a spherical form in the configuration shown in FIG. 1, the core portion may not be formed in a fixed shape in the configuration shown in FIG. 2.

In addition, the core portion may be formed in various other shapes, such as a cylindrical shape. Moreover, in the case of the thermoelectric powder according to the present disclosure, the core portion may be configured so that various shapes such as spherical, elliptical and amorphous shapes are mixed together.

In addition, the core portion may be made of a single Skutterudite particle as shown in FIG. 1. For example, the core portion may be made of a single $CoSb_3$ particle. However, the present disclosure is not limited to this embodiment.

Figure 3:
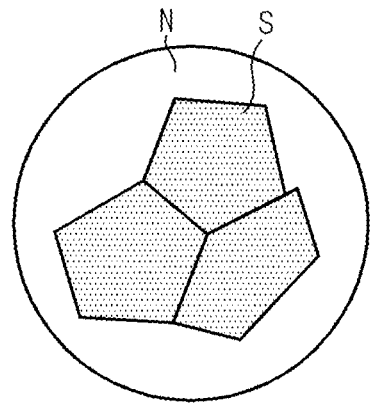
FIG. 3 is a schematic diagram showing thermoelectric powder according to another embodiment of the present disclosure.

FIG. 3 is a schematic diagram showing thermoelectric powder according to another embodiment of the present disclosure.

Referring to FIG. 3, the core portion S may made of a plurality of Skutterudite particles. For example, the core portion may be made of three $CoSb_3$ particles as shown in FIG. 3. However, the number of Skutterudite particles is just one example, and the core portion may be made of two particles or four or more particles.

Meanwhile, a plurality of Skutterudite particles may be composed of only the same kind of material or may include other kinds of materials.

In addition, a plurality of Skutterudite particles may be provided in an agglomerated form as shown in FIG. 3. In other words, the core portion may be configured so that at least a portion of the plurality of Skutterudite particles is united together while being in contact with each other. However, the present disclosure is not limited to this embodiment, and at least a part of the plurality of Skutterudite particles may be provided to be separated from other particles.

The thermoelectric powder according to an embodiment of the present disclosure may have a core portion of various shapes. For example, the thermoelectric powder according to the present disclosure may include a core portion having various numbers, types, and/or shapes of particles. For example, the thermoelectric powder according to the present disclosure may include both the core portion as shown in FIG. 1 and the core portion as shown in FIG. 3.

Meanwhile, the coating portion may be coated on the surface of the core portion as shown in FIG. 1 or 3 so that the thermoelectric powder has a spherical shape as a whole, but the present disclosure is not limited to this embodiment.

Figure 4:
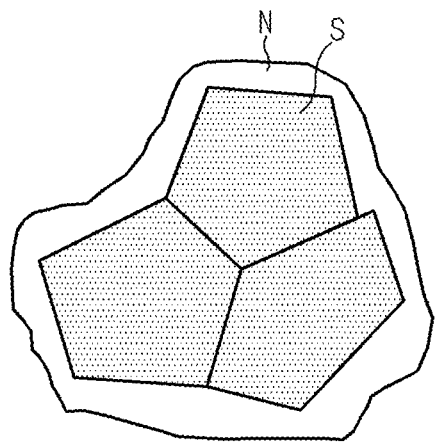
FIG. 4 is a schematic diagram showing thermoelectric powder according to another embodiment of the present disclosure.

FIG. 4 is a schematic diagram showing thermoelectric powder according to another embodiment of the present disclosure.

Referring to FIG. 4, the coating portion N may be coated with a uniform or similar thickness on the surface of the core portion S. In this case, the coating portion may be formed in a film form covering the surface of the core portion. In addition, at this time, the overall shape of the thermoelectric powder is be formed to have an overall shape similar to that of the core portion, instead of the spherical shape as shown in FIG. 3.

In addition, the coating portion may not be formed with a uniform thickness but be formed in an amorphous shape with no specially defined shape.

Meanwhile, the coating portion may be coated on the entire surface of the core portion as shown in FIG. 1. However, the present disclosure is not limited to this form.

Figure 5:
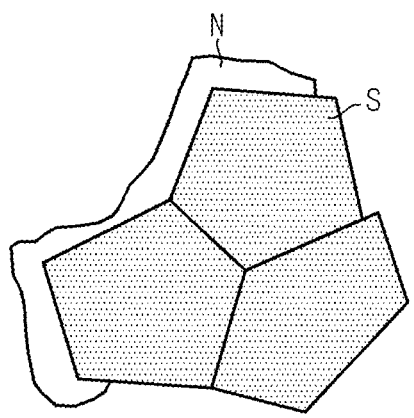
FIG. 5 is a schematic diagram showing thermoelectric powder according to another embodiment of the present disclosure.

FIG. 5 is a schematic diagram showing thermoelectric powder according to another embodiment of the present disclosure.

Referring to FIG. 5, the coating portion N may exist in a coating form only on a portion of the core portion S. In other words, even though the coating portion may be formed on the entire surface of the core portion as shown in FIG. 3, the coating portion may also be coated on only a part of the surface of the core portion as shown in FIG. 5.

The thermoelectric powder according to the present disclosure may include either the powder where the coating portion is coated on the entire surface of the core portion as shown in FIG. 3 or the powder where the coating portion is coated on only a part of the surface of the core portion as shown in FIG. 5, or both of them.

Meanwhile, the coating portion may further include other elements or compounds than the Ni-containing material. In particular, the coating portion may further include at least one of In, Sb, Co, O, C and Cl, or a compound thereof.

For example, the coating portion of the thermoelectric powder according to the present disclosure may include InSb, $In_2O_3$ and/or carbon. Additional materials such as InSb, $In_2O_3$ and/or carbon may be formed in the form of a film on the surface of the core portion together with the Ni-containing material to configure a coating portion. For example, the coating portion may include a large amount of InSb as a main material in comparison to the Ni-containing material. Alternatively, such additional material may be in the form of particles, rather than in the film form, and be located at the coating portion.

In the thermoelectric powder according to an embodiment of the present disclosure, the core portion S can be configured to have an average particle size of several ten nanometers (nm) to several hundred micrometers (um). For example, the average particle size of the core portion may be 1 nanometer to 100 micrometers.

In addition, in the thermoelectric powder according to an embodiment of the present disclosure, the coating portion N may be configured to have an average thickness of several nanometers to several micrometers. In other words, the coating portion is formed with a film shape surrounding the surface of the core portion, and the thickness of the film may be several nanometers to several micrometers. For example, the average thickness of the coating portion may be 0.1 nanometers to 10 micrometers.

In particular, in the thermoelectric powder according to an embodiment of the present disclosure, the ratio of the average particle size of the core portion to the average thickness of the coating portion may be 1 to 100,000. In other words, assuming that the average thickness of the coating portion is t and the average particle size of the core portion is D, D/t may be 1 to 100,000.

According to this embodiment, a thermoelectric conversion material may be easily manufactured using the thermoelectric powder according to the present disclosure, and the thermoelectric conversion performance of the thermoelectric conversion material may be further improved. In particular, when the thermoelectric powder according to the present disclosure is sintered, sintering may be performed well, and the material forming the coating layer may be positioned well at the grain boundary of the sintered product.

Preferably, the thermoelectric powder according to an embodiment of the present disclosure may further include fine particles. The fine particles are distinguished from the Skutterudite particles of the core portion and may be configured to have a smaller size, namely a smaller average particle size, than the Skutterudite particles. For example, the fine particles may have a size of 0.5 nanometers to 500 nanometers.

The fine particles may be located inside or on the surface of the coating portion. For example, the fine particles may have a size smaller than the thickness of the coating portion and be included inside the coating portion. Alternatively, the fine particles may have a size larger than the thickness of the coating portion, so that some of the fine particles may be included within the coating portion, and others of the fine particles may be exposed to the outside of the coating portion. Moreover, the fine particles may be located at least partially at the interior of the core portion, for example among the plurality of particles of the core portion.

The fine particles may be formed of materials and structures different from the Skutterudite particles of the core portion.

For example, the fine particles may contain at least one of Ni, In, Sb, Co, O, C and Cl. In more detail, the fine particles may include a Ni compound such as $Ni_{1-x}Co_xSb$ (here, $0 \leq x < 1$), In oxide such as $In_2O_3$, In compound such as InSb and/or carbon.

The fine particles may be formed in various shapes. For example, the fine particles may be in the form of a dot, such as a circle or an ellipse, when being observed from one side. Alternatively, the fine particles may be formed in the shape of a ribbon hollowed at a central portion, when being observed from one side.

One or more fine particles may be included in the thermoelectric powder, and the size, shape, position or the like of the fine particles may be at least partially different from each other.

In particular, the fine particles may be formed with a lamella structure. In other words, the fine particles may be formed with a layered structure having a stripe form on the surface and/or inside thereof. For example, the fine particles may be a compound containing Ni, Co and Sb, such as $Ni_{1-x}Co_xSb$ (here, $0 \leq x < 1$), and the fine particles may also have a lamella-like fine structure not only at the surface thereof but also at the interior thereof.

When the thermoelectric material is prepared using the thermoelectric powder according to the present disclosure, due to the fine particles formed in the lamella structure, the thermal conductivity may be lowered and the thermoelectric conversion characteristics may be improved more effectively.

In addition, the thermoelectric powder according to an embodiment of the present disclosure may further include at least one pore. Here, the pore may include both open pores and closed pores.

The pore may be included in the core portion and/or the coating portion. For example, the pore may be located inside the core portion or inside the coating portion. Here, the pore may have an average size of 0.5 nanometers to 500 nanometers, but the present disclosure is not limited to this embodiment.

When the thermoelectric material is manufactured using the thermoelectric powder according to the present disclosure, pores may be included in the thermoelectric material, and the thermal conductivity of the thermoelectric material is lowered due to phonon scattering induced by the pores, thereby further improving the thermoelectric conversion performance.

Figure 6:
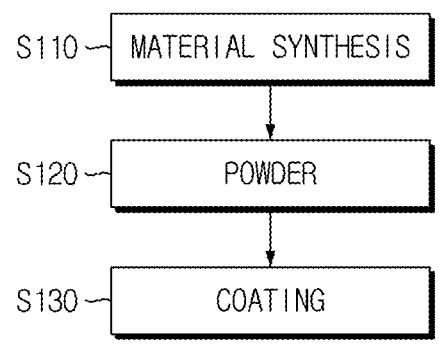
FIG. 6 is a schematic flowchart for illustrating a method for manufacturing thermoelectric powder according to an embodiment of the present disclosure.

FIG. 6 is a schematic flowchart for illustrating a method for manufacturing thermoelectric powder according to an embodiment of the present disclosure.

As shown in FIG. 6, a method of manufacturing a thermoelectric powder according to the present disclosure may include a material synthesizing step (S110), a powder forming step (S120), and a coating step (S130).

In the material synthesizing step (S110), a Skutterudite material is synthesized, and a common Skutterudite material synthesis method may be employed. For example, the material synthesizing step may include a step of mixing raw materials for forming the Skutterudite material and a step of synthesizing the Skutterudite-based compound by thermally treating the mixed raw materials.

In this material synthesizing step (S110), the raw materials may be mixed by means of hand milling, ball milling, planetary ball mill or the like using a mortar, but the present disclosure is not limited to such specific mixing methods.

In addition, in the material synthesizing step (S110), the thermal treatment synthesis may be performed by putting the mixture into an electric furnace and heating the mixture at a predetermined temperature for a predetermined time. For example, in Step S110, the mixture may be heated to a temperature of 400° C. to 800° C. for 1 hour to 40 hours. In particular, the thermal treatment synthesis may be performed by means of a solid state reaction (SSR) method, a melting method, or a gas pressure synthesis (GPS) method.

For example, Step S110 may be performed after a powder is hand-pressed to form a green body and then the green body is charged into a chamber and vacuum-maintained at $10^{-2}$ torr with a rotary pump. At this time, in Step S110, heating may be performed in an Ar environment.

In the powder forming step (S120), the Skutterudite-based composite prepared in STEP S110 is shaped into a powder form. If the Skutterudite composite is formed into a powder form in this way, Ni or Ni compound may be coated better on the Skutterudite material in Step S130. In addition, if the Skutterudite composite is shaped in a powder form, the convenience of the sintering process in the future may be improved, and the sintering density may be further increased. Preferably, in Step S120, the particle size may be 1 nanometer (nm) to 500 micrometers (um). In more detail, in Step S120, the particle size may be set to 25 micrometers to 85 micrometers.

In the coating step (S130), the Skutterudite material prepared in a powder form is coated with a material containing Ni. For example, the coating step (S130) may be performed by dipping the Skutterudite powder in a solution containing Ni or a Ni compound and then performing sonication and/or stirring thereto. Here, the solution containing Ni or Ni compound may include a nickel salt, a reducing agent, a pH regulator, a complexing agent, and the like. At this time, the nickel salt may be contained in an amount of 0.5 to 5 wt % based on the total weight of the solution. In addition, the complexing agent, the reducing agent and the like may be contained in an amount of less than 1 wt %. The solution used in the coating step may contain various other components. In addition, the present disclosure is not limited to the coating method, and Step S130 may be performed in various other ways.

The thermoelectric material according to the present disclosure may be prepared using the thermoelectric powder according to the present disclosure as described above. In particular, the thermoelectric material according to the present disclosure may be obtained by sintering the thermoelectric powder according to the present disclosure. For example, the method of manufacturing a thermoelectric material according to the present disclosure may include Step S110 to Step S130 shown in FIG. 6 and further include a step of sintering the coated powder after Step S130.

Thus, the thermoelectric powder including the core portion and the coating portion as shown in FIGS. 1 to 5 may be in a form which has experienced till Step S130, namely in a form before the sintering. In addition, if the thermoelectric powder according to the present disclosure is sintered, a thermoelectric material according to the present disclosure may be manufactured.

In the sintering step, the Skutterudite powder coated with Ni or Ni compound in Step S130 is sintered. Here, the sintering step may be performed by means of a hot press (HP) method or a spark plasma sintering (SPS) method. In the thermoelectric material according to the present disclosure, when such a pressure sintering method is used, it is easy to obtain a high sintering density and improved thermoelectric performance. However, the present disclosure is not limited to the sintering method, and the sintering step may be performed in various other ways such as HPHT (High Pressure High Temperature) and HPT (High Pressure Torsion).

In addition, the sintering step may be carried out in a vacuum, or in a state where a gas such as Ar, He, or $N_2$ containing a portion of hydrogen or not containing hydrogen flows, or in an inert gas environment.

Figure 7:
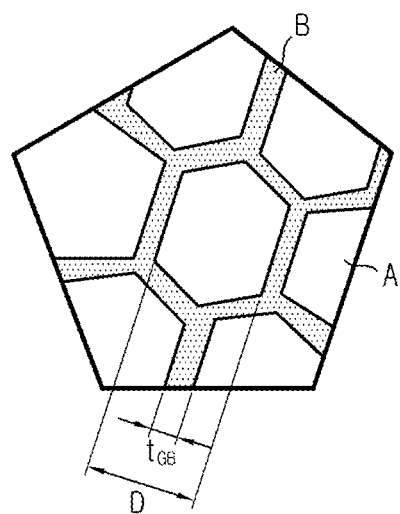
FIG. 7 is a schematic diagram showing a thermoelectric material prepared using the thermoelectric powder according to an embodiment of the present disclosure.

FIG. 7 is a schematic diagram showing a thermoelectric material prepared using the thermoelectric powder according to an embodiment of the present disclosure.

Referring to FIG. 7, the thermoelectric material according to the present disclosure may include a plurality of Skutterudite grains (A) and a Ni-containing material (B).

Here, the Skutterudite grain is a grain containing one or more types of Skutterudite materials, and a plurality of Skutterudite grains may be adjacently gathered to form a matrix. In particular, the Skutterudite grains may be composed of the Skutterudite material which forms the core portion of the thermoelectric powder according to the present disclosure.

The Skutterudite grains may be formed in various sizes and shapes. For example, the size of Skutterudite grains may be several ten nanometers (nm) to several hundred micrometers (um). Moreover, the size of the Skutterudite grains may be 1 um to 100 um. In addition, the Skutterudite grains may be formed into various shapes such as spherical, acicular, and plate-like shapes depending on the synthesis conditions.

In particular, in the thermoelectric material according to the present disclosure, a Ni-containing material may be interposed between the Skutterudite grains. In other words, in the thermoelectric material according to the present disclosure, a plurality of Skutterudite grains configure a matrix, and a Ni-containing material may exist at a grain boundary in the matrix, namely at a portion indicated by B. In addition, a material such as InSb may be included at the portion indicated by B as a main material in addition to the Ni-containing material.

The Ni-containing material is a material containing at least Ni and may be located at a boundary between the Skutterudite grains, namely at a grain boundary. In addition, the Ni-containing material may be a Ni single substance composed only of a Ni single element, or a Ni compound formed by combining a Ni element with another element. In addition, the Ni-containing material may also be a material containing both a Ni single substance and a Ni compound.

In the thermoelectric material according to an embodiment of the present disclosure, the Ni-containing material may be interposed in a film form at the boundary of the Skutterudite grain. In other words, as shown in FIG. 7, the Ni-containing material is formed in a layer form such as a thin film to a thick film along the grain boundary of the thermoelectric material matrix. However, in this case, various materials other than the Ni-containing material may be included together in the material of a layer form.

As described above, in the thermoelectric material according to an aspect of the present disclosure, the Ni-containing material may be filled in a layer form or the like in at least a part of the grain boundary of the thermoelectric material matrix, and thus the corresponding grain boundary may become thicker in comparison to an existing Skutterudite thermoelectric material. For example, the Ni-containing material film containing the Ni-containing material may be formed to have a thickness of 0.5 nanometers (nm) to 500 nanometers (nm), particularly 2 nanometers (nm) to 100 nanometers (nm).

In addition, the Ni-containing material may be formed such that the ratio of the size of the Skutterudite grain to the thickness of the Ni-containing material film is 10 to 500,000. Here, the thickness of the Ni-containing material film and the size of the Skutterudite grain may be determined by the lengths of the Ni-containing material film and Skutterudite grain corresponding to the same straight line.

For example, as shown in FIG. 7, in the thermoelectric material according to an embodiment of the present disclosure, assuming that the thickness of the Ni-containing material film is denoted as $t_{GB}$ and the size of the Skutterudite grain is D, $D/t_{GB}$ may be 10 to 500,000.

According to this embodiment, the thermoelectric characteristics may be improved by effectively scattering the phonon to lower the thermal conductivity.

In addition, the Ni-containing material may be formed such that the ratio of the volume of the Skutterudite grain to the volume of the Ni-containing material is 20 to 200.

For example, in the thermoelectric material according to the present disclosure, assuming that the volume of the Skutterudite grain is called $V_{grain}$ and the volume of the Ni-containing material located at the grain boundary is $V_{GB}$, $V_{grain}/V_{GB}$ may be 20 to 200.

The Ni-containing material film may be formed to have an overall uniform thickness, or may be formed to have a partially different thickness. In addition, as shown in FIG. 7, the Ni-containing material film may be formed to fill the grain boundary as a whole, the present disclosure is limited to this form. For example, the Ni-containing material film may be formed to fill only some grain boundaries among the grain boundaries of the matrix.

The Ni-containing material included at the grain boundary in the thermoelectric material according to the present disclosure may include the Ni-containing material provided in the coating portion of the thermoelectric powder as it is, or may be formed as a secondary phase of the coating portion and the core portion during the sintering process.

Here, if the Ni compound is included at the grain boundary of the thermoelectric material, the Ni compound may further include at least one of In, Sb and Co together with Ni. For example, the Ni compound at the grain boundary of the thermoelectric material may include at least one of NiSb and (Ni, Co)Sb. In particular, the Ni compound at the grain boundary of the thermoelectric material may include at least one of NiSb and $Ni_{1-x}Co_xSb$ (here, 0<x<1). In this case, the grain boundaries as indicated by B in FIG. 7 may be configured so that a material such as a compound of Ni and Sb like NiSb or a compound of Ni, Co and Sb fills the inter boundary of the matrix such as $CoSb_3$.

Meanwhile, in the thermoelectric material according to an embodiment of the present invention, the Ni-containing material included at the grain boundary may exist in the form of a film or particles.

In addition, the thermoelectric material according to an embodiment of the present disclosure may further include other elements or compounds in addition to the Ni-containing material at the boundary of the Skutterudite grains. For example, the thermoelectric material according to the present disclosure may further include at least one element of In, Sb, Co, O, C and Cl, or a compound thereof at the grain boundary of the matrix.

For example, InSb, $In_2O_3$ and/or carbon may be present at the grain boundary of the thermoelectric material according to an embodiment of the present disclosure.

Additional materials such as InSb, $In_2O_3$ and/or carbon may be formed in a film shape at the grain boundary as indicated by B in FIG. 7, similar to the Ni-containing material. For example, the layer formed at the grain boundary as indicated by B in FIG. 7 may include a greater amount of InSb as a main material in comparison to the Ni-containing material. Alternatively, such additional material may be formed in the form of particles and located at the grain boundary. This additional material not containing Ni may be further formed as a secondary phase of the Skutterudite material.

In addition, the thermoelectric material according to an embodiment of the present disclosure may further include fine grains in addition to the Skutterudite grains, and the fine grains may be formed smaller than the Skutterudite grains.

Here, the fine grains are grains distinguished from the Skutterudite grains, and may be referred to as fine grains in the point that they may be smaller in size than the Skutterudite grains.

In particular, the fine grains may be formed in a nanometer size smaller than the Skutterudite grains. For example, the fine grains may have a size (a diameter) of 1 nanometer to 1 micrometer.

The fine grains may be located at the boundary of the Skutterudite grains but may also be located at the pore, the interior and/or the outer surface of the Skutterudite grains, without being limited to the above. The fine grains may be originated from the fine particles which may be included in the thermoelectric powder, or may be additionally formed as a secondary phase of the Skutterudite material during the sintering process or the like.

A plurality of fine grains may be included in the thermoelectric material according to the present disclosure, and at least a part of the fine grains may have different sizes, shapes or positions. At this time, the fine grains may exist in an aggregated form or in a separated form.

The fine grains may be formed with materials and structures different from those of the Skutterudite grains.

For example, the fine grains may include at least one of Ni, In, Sb, Co, O, C and Cl. In more detail, the fine grains may include materials such as a Ni compound such as $Ni_{1-x}Co_xSb$ (here, $0 \leq x < 1$), an In oxide such as $In_2O_3$, and an In compound such as InSb and/or carbon.

The fine grains may be formed in various shapes. For example, the fine grains may be in the form of a dot, such as a circle or an ellipse, when being observed from one side. Alternatively, the fine grains may be formed in the shape of a ribbon hollowed at a central portion, when being observed from one side.

A plurality of fine grains may be included in the thermoelectric material, and the size, shape, position or the like of the fine grains may be at least partially different from each other.

In particular, the fine grains may be formed with a lamella structure. In other words, the fine grains may be formed with a layered structure having a stripe form on the surface and/or inside thereof. For example, the fine grains may be a compound containing Ni, Co and/or Sb, such as $Ni_{1-x}Co_xSb$ (here, $0 \leq x < 1$), and the fine grains may also have a lamella-like fine structure not only at the surface thereof but also at the interior thereof.

According to this configuration of the present disclosure, the thermal conductivity may be lowered and the thermoelectric conversion characteristics may be improved effectively due to the fine grains of a lamella structure.

In addition, the thermoelectric material according to an embodiment of the present disclosure may further include at least one pore. Here, the pore may include both open pores and closed pores.

In particular, the pore may be located at the interior and/or the grain boundary of the Skutterudite grains. Here, the pore included in the thermoelectric material may have a size (for example, a diameter) of 0.5 nanometer (nm) to 1 micrometer (um), particularly 1 nanometer to 1 micrometer. Moreover, the pore may have a size of 1 nanometer to 500 nanometers.

According to this embodiment of the present disclosure, since phonon scattering is induced by the pore, the thermal conductivity of the thermoelectric material may be lowered, thereby further improving the thermoelectric conversion performance. The pore included in the thermoelectric material may be originated from a pore included in the thermoelectric powder or may be formed additionally during the sintering process or the like.

In particular, in the thermoelectric material according to the present disclosure, the Ni-containing material located at the boundary of the Skutterudite grain may be spontaneously formed in the sintering step. For example, $Ni_{1-x}Co_xSb$ (here, $0 \leq x < 1$) such as NiSb located at the boundary of the Skutterudite grain may not be artificially located at the grain boundary but may be located by self-guidance in the sintering step.

In addition, in the thermoelectric material according to the present disclosure, at least one of In, Sb, Co, O, C and Cl, or a compound thereof, located at the boundary of the Skutterudite grains may be formed spontaneously in the sintering step. For example, InSb, $In_2O_3$ and carbon located at the boundary of the Skutterudite grains may not be artificially located at the grain boundary but may be located by self-guidance in the sintering step.

In addition, in the thermoelectric material according to the present disclosure, the fine grains may be formed spontaneously in the sintering step. For example, the fine grains located at the interior, surface, pores or the like of the Skutterudite grains may not be artificially located at the corresponding position but may be located by self-guidance in the sintering step.

In the thermoelectric material according to the present disclosure, the ZT value may be effectively improved over a wide temperature range in comparison to the existing Skutterudite thermoelectric material. Therefore, the thermoelectric material according to the present disclosure may be used instead of an existing thermoelectric conversion material or used for a thermoelectric conversion element in addition to an existing compound semiconductor.

The thermoelectric conversion element according to the present disclosure may include the thermoelectric material according to the present disclosure. In particular, the thermoelectric material according to the present disclosure may be manufactured by sintering the thermoelectric powder according to the present disclosure.

In addition, the thermoelectric power generation apparatus according to the present disclosure may include the thermoelectric powder according to the present disclosure. In other words, the thermoelectric power generation apparatus according to the present disclosure may include the thermoelectric material according to the present disclosure. In particular, the thermoelectric material according to the present disclosure exhibits a high ZT value over a wide temperature range, such as a temperature range of 50° C. to 600° C., and thus may be more usefully applied for thermoelectric power generation.

In addition, the thermoelectric material according to the present disclosure may be made in the form of a bulk thermoelectric material.

Hereinafter, the present disclosure will be described in detail through examples and comparative examples. The examples of the present disclosure, however, may take several other forms, and the scope of the present disclosure should not be construed as being limited to the following examples. The examples of the present disclosure are provided to more fully explain the present disclosure to those having ordinary knowledge in the art to which the present disclosure pertains.

EXAMPLE

In-SKTD ($In_{0.6}Co_4Sb_{12}$) powder was charged into a solution containing Ni and was heated in a bath of 20° C. to 90° C. Here, the solution containing Ni contained water as a solvent, where a nickel salt was contained in an amount of 1 wt % based on the total weight of the solution, and the solution was mixed with a carboxylic acid as a complexing agent, sodium hypophosphite as a reducing agent, and sodium hydroxide and nitric acid as a pH regulator. Then, sonication and stirring were carried out, followed by washing with ethanol, methanol, and distilled water. At this time, ethanol and methanol washing was used in parallel with centrifuging and hand washing. Then, the washed composition was dried in a drying oven to obtain a sample of the thermoelectric powder according to the embodiment of the present disclosure.

Comparative Example

In-SKTD powder identical to the sample of the example was proposed as a comparative example. However, unlike the sample of the example, in case of the sample of the comparative sample, a process of charging with a solution containing Ni and then drying for Ni coating was not separately performed.

Figure 8:
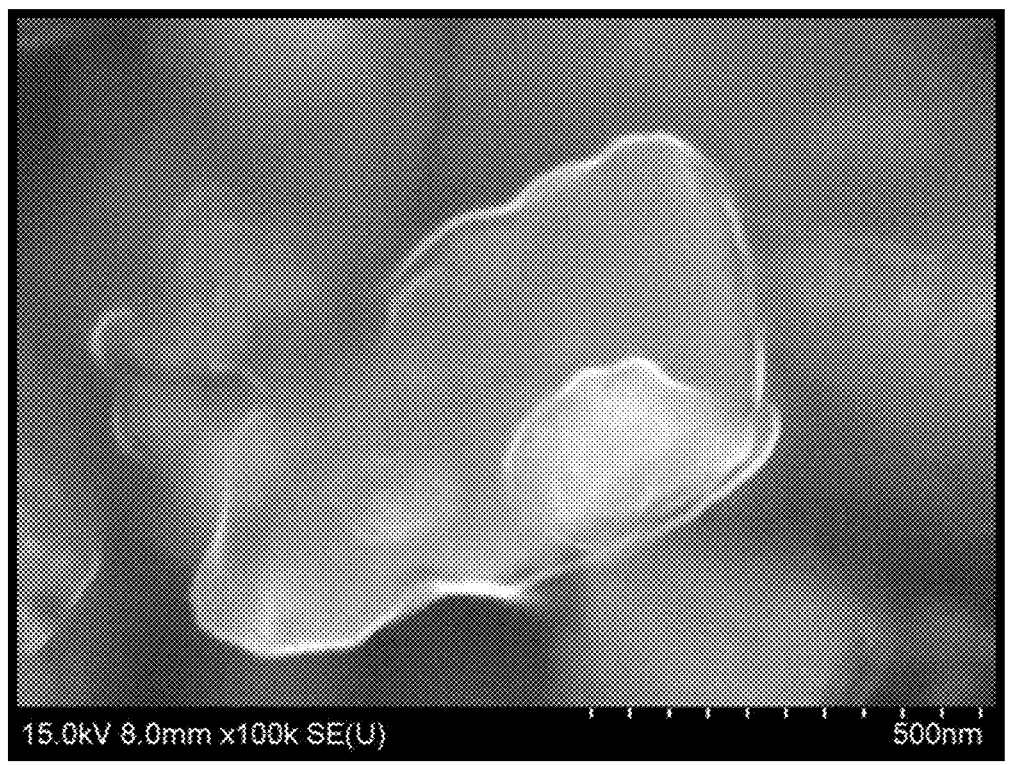
FIG. 8 is a scanning electron microscope (SEM) image showing thermoelectric powder according to an embodiment of the present disclosure.
Figure 9:
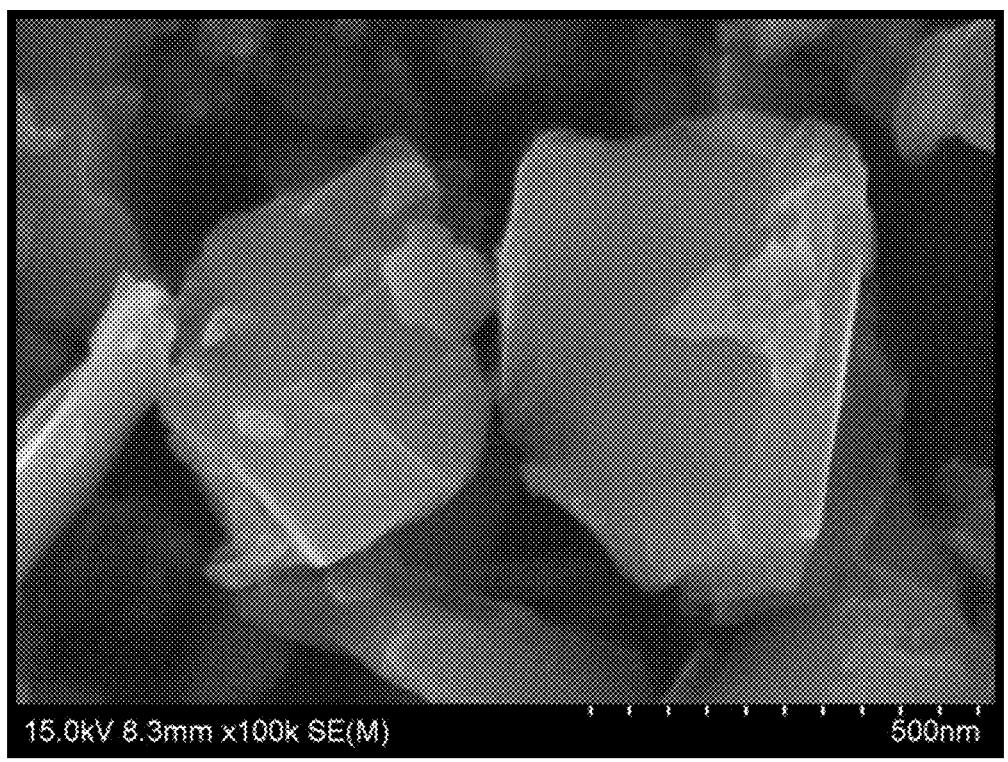
FIG. 9 is an SEM image showing thermoelectric powder according to a comparative e example.

A scanning electron microscope (SEM) image was taken on a part of the sample of the example obtained as above, as shown in FIG. 8, and an SEM image was taken on a part of the sample of the comparative example, as shown in FIG. 9.

First, referring to FIG. 8, it may be found that in the case of the thermoelectric powder according to the present disclosure, namely the sample of the example, a coating layer is formed on the surface of the particle, different from the sample of the comparative example. In other words, in the configuration of FIG. 8, a bright and thin film surrounds the surface of the particle. At this time, the particle may be regarded as a core portion of the thermoelectric powder, and the layer surrounding the surface of the particle may be regarded as a coating portion of the thermoelectric powder.

Meanwhile, referring to FIG. 9, a particle of existing Skutterudite thermoelectric powder is shown, and no coating layer is separately observed on the surface of the particle. In other words, in the case of the comparative sample shown in FIG. 9, it may be found that a coating layer is not formed on the surface of the particle, different from the sample of the example of FIG. 8.

Figure 10:
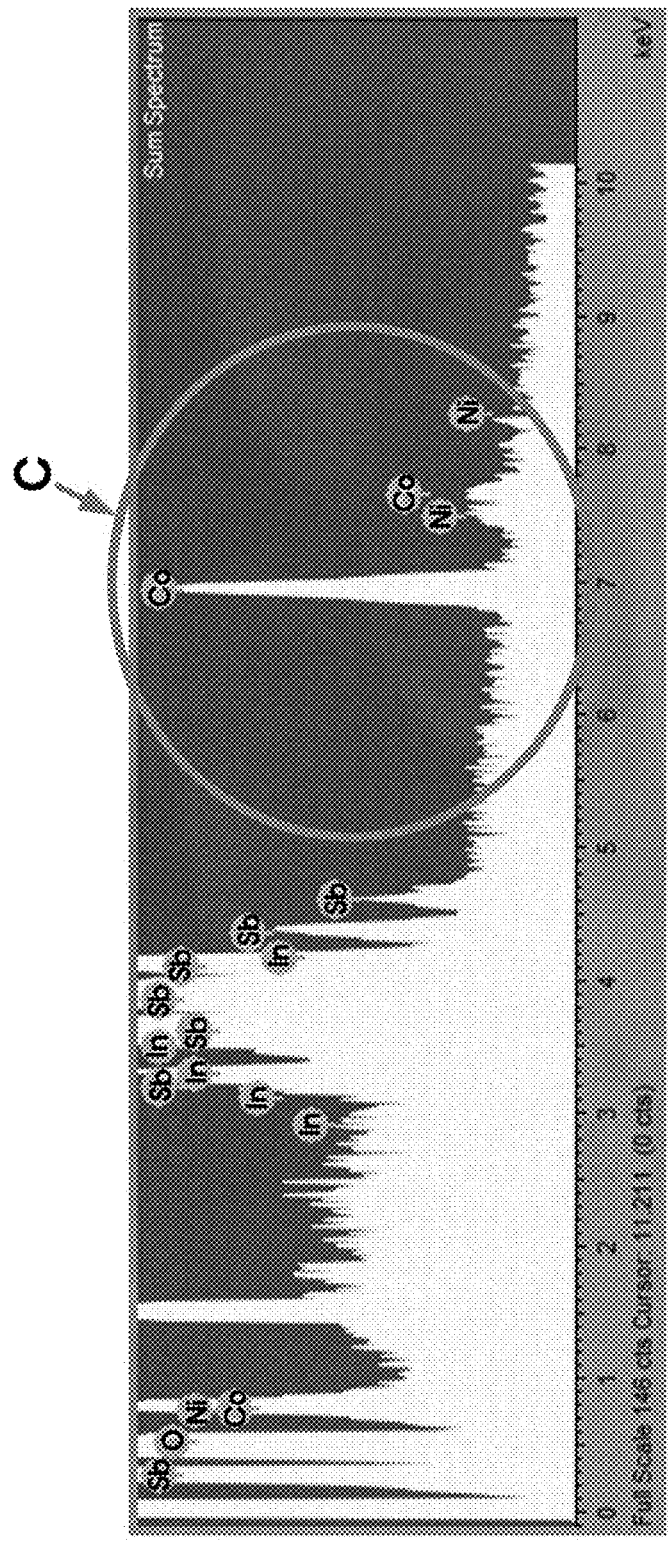
FIG. 10 is a graph showing an energy dispersive spectroscopy (EDS) analysis result for a sample of the example depicted in FIG. 8.

FIG. 10 is a graph showing an energy dispersive spectroscopy (EDS) analysis result for a sample of the example depicted in FIG. 8.

Seeing the results in FIG. 10, an In peak, a Co peak and a Sb peak are mainly observed as main components of the Skutterudite-based thermoelectric powder, and it may be found that a Ni peak is clearly formed separately in addition to the above peaks. In particular, in a portion indicated by C, the Ni peak is clearly observed. Therefore, according to the measurement results of the present disclosure, it may be understood that the thermoelectric powder according to the present disclosure contains Ni or Ni compound. In addition, it may be understood that the Ni-containing material is mainly included in the coating layer coated on the surface of the particle, seeing the measurement results of FIGS. 8 and 9.

Figure 11:
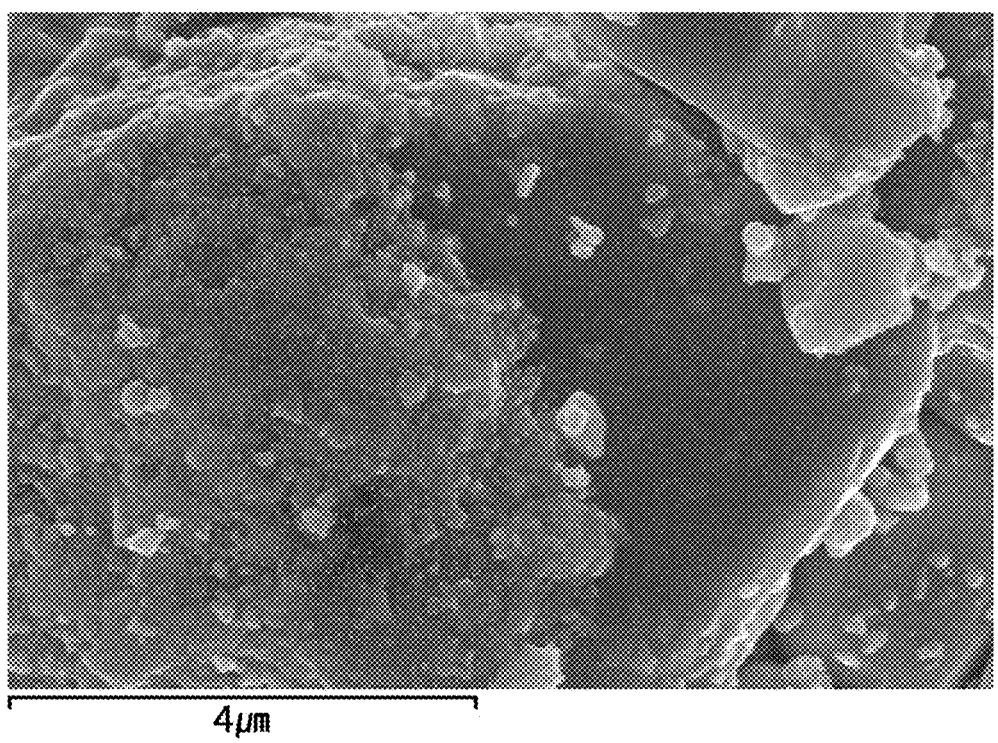
FIG. 11 is an SEM image showing an EDS component mapping result for the example of the present disclosure.

FIG. 11 is an SEM image showing an EDS component mapping result for the example of the present disclosure. In addition, FIG. 12 is a graph showing an EDS analysis result for a sample of the example depicted in FIG. 11.

First, referring to FIG. 11, it may be found that in the case of the thermoelectric powder sample according to the present disclosure, a Ni component as indicated by a small dot (a red dot) is included. In particular, the Ni component may be included to at least partially surround the surface of the particle. Thus, in the sample of the example, it may be understood that Ni or Ni compound is successfully coated on the surface of the particle.

Figure 12:
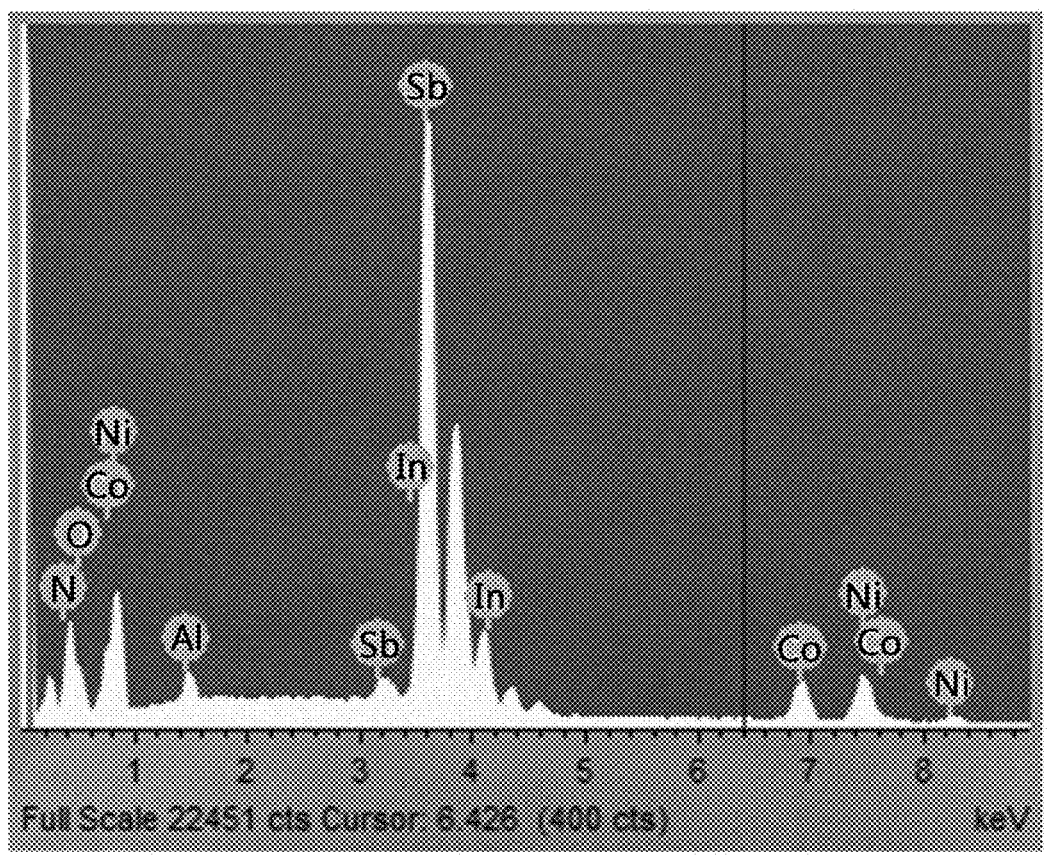
FIG. 12 is a graph showing an EDS analysis result for a sample of the example depicted in FIG. 11.

In addition, referring to the analysis graph of FIG. 12 with respect to the sample of this example, a Ni peak is clearly observed along with the In, Co and Sb peaks.

Meanwhile, the sample of the example and the sample of the comparative example were sintered by means of a hot press (HP) method. In addition, SEM images of various portions of the sintered sample are shown in FIGS. 13 to 16, and an SEM image of the sample prepared in the comparative example is shown in FIG. 17.

First, referring to FIGS. 13 to 16, in the case of the sample of the example according to the present disclosure, a matrix including a plurality of Skutterudite grains is formed, and a phase different from the Skutterudite grains is found at the grain boundary of the matrix.

Figure 13:
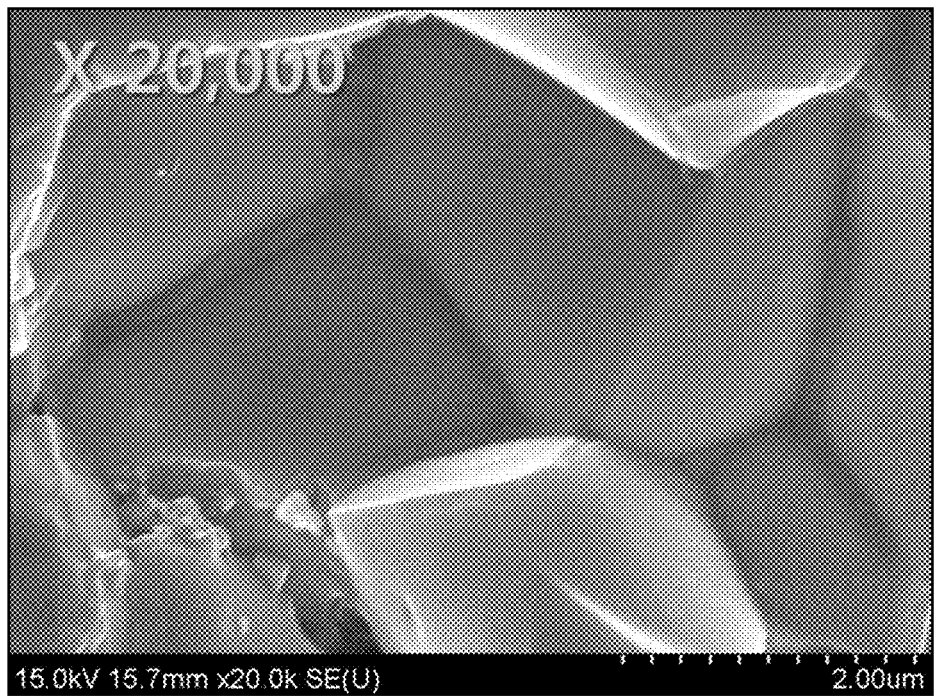
FIGS. 13 to 16 are SEM images showing a sintered product formed by sintering the thermoelectric powder according to the example of the present disclosure, namely the thermoelectric material according to the example of the present disclosure, at various locations.
Figure 18:
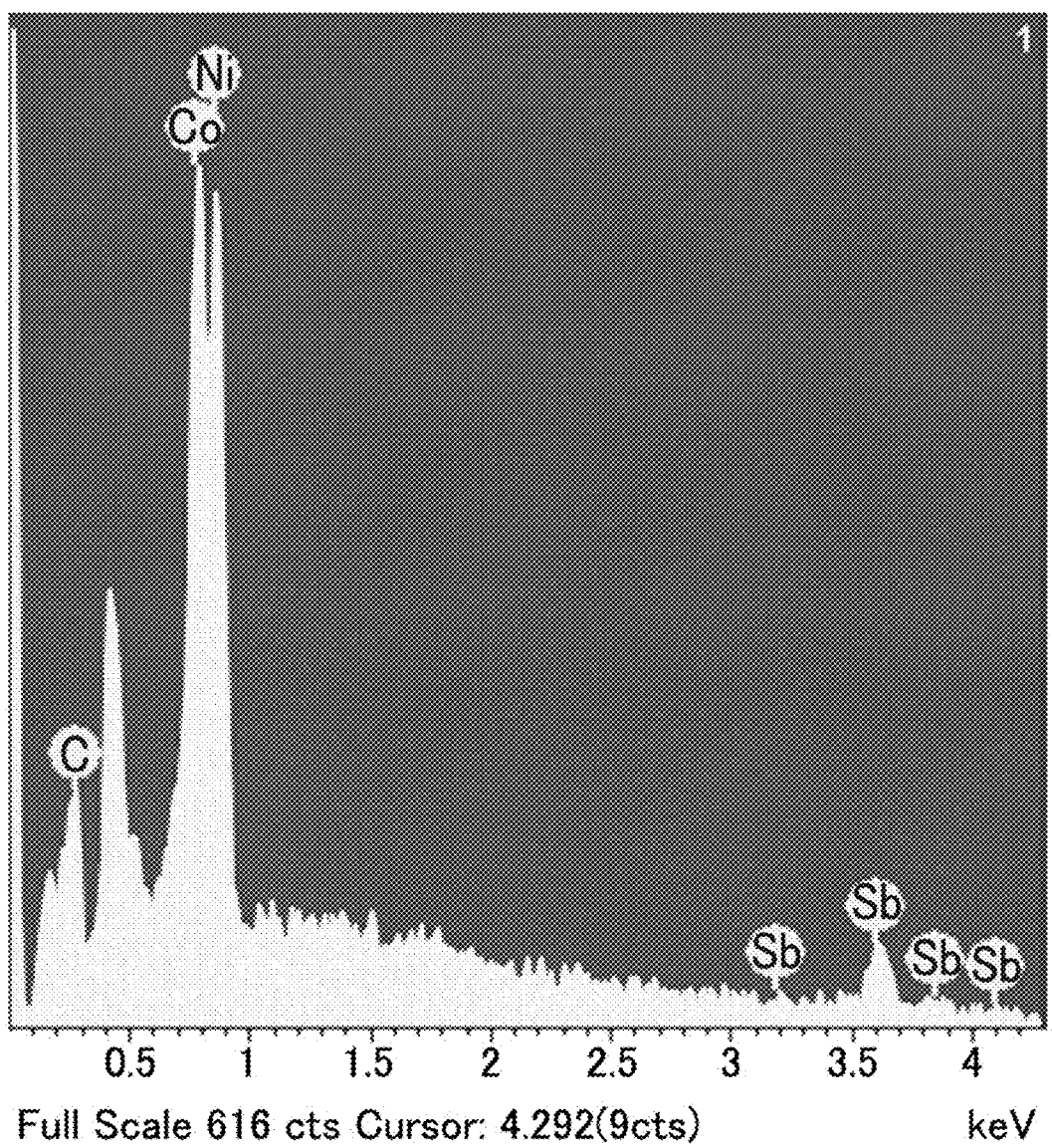
FIG. 18 is a graph showing an EDS analysis result of a grain boundary for a sample according to the example of the present disclosure.

In more detail, referring to FIG. 13, the thermoelectric material according to the present disclosure may be formed such that a predetermined material is entirely filled in the grain boundary, and at this time, the material filled in the grain boundary mainly includes InSb, and Ni or Ni compound may be further included, as found in the measurement of FIG. 18.

Figure 17:
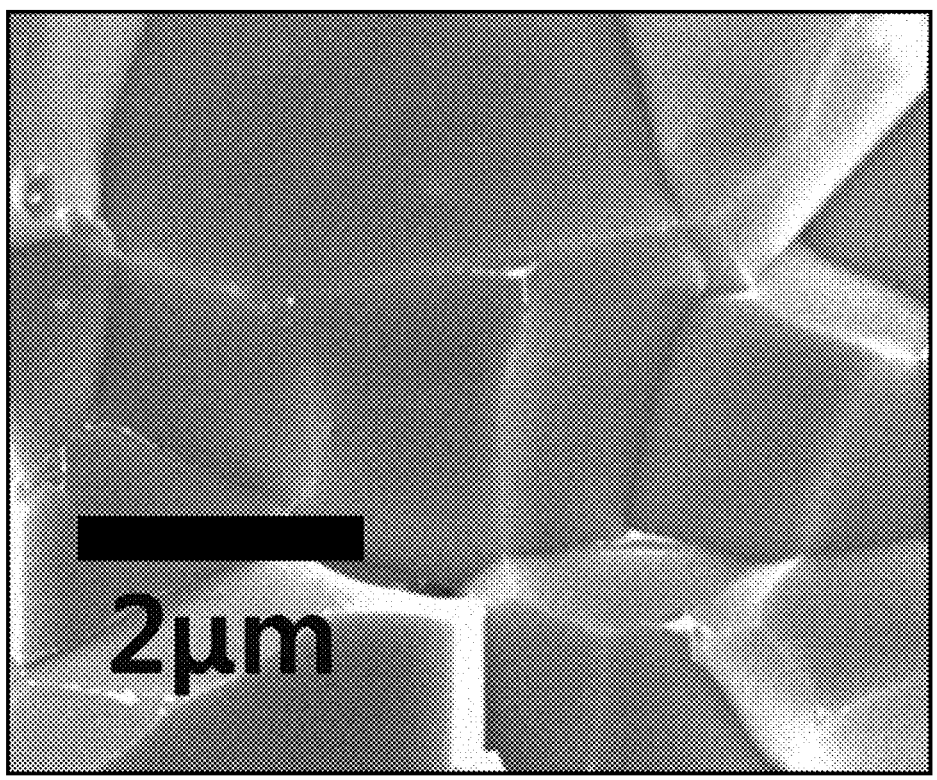
FIG. 17 is an SEM image showing a thermoelectric material according to a comparative example.

Meanwhile, referring to FIG. 17, in the case of the comparative sample, the matrix including a plurality of Skutterudite grains is formed, similar to that of the sample of the example. But as shown in FIG. 17, it is not observed that a predetermined material is filled in the grain boundary of the matrix. Therefore, in the case of the comparative sample, it may be regarded that a structure containing a Ni-containing material or the like is not present in the grain boundary.

FIG. 18 is a graph showing an EDS analysis result of a specific part of grain boundary for a sample according to the example of the present disclosure.

Seeing the result of FIG. 18, Ni and Co peaks are mainly formed, and a Sb peak is also formed along with them. Therefore, according to the measurement results, it may be understood that the material filled in a film form at the boundary of the Skutterudite grains in FIG. 13 includes a compound containing Ni, Co and/or Sb as the Ni-containing material.

Figure 14:
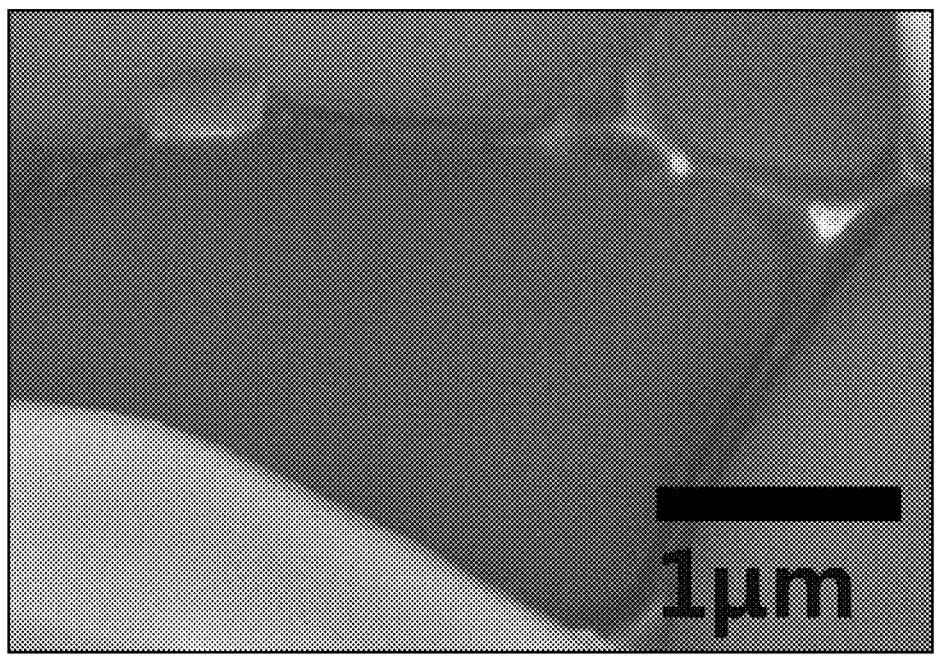

In addition, referring to FIG. 14, the thermoelectric material according to the present disclosure may be configured such that a predetermined material is filled in a part of the grain boundary. At this time, a Ni-containing material may be included in the material partially filled in the grain boundary, as being checked in the same manner as in FIG. 18.

As described above, in the matrix composed of a plurality of Skutterudite grains, the Ni-containing material may be filled in a film form in all or a part of the grain boundary.

In addition, in the thermoelectric material according to the present disclosure the grain boundary may be filled with elements or materials other than the Ni-containing material as described above. For example, in the configuration shown in FIG. 13 or 14, the material filled in the grain boundary may include InSb, $In_2O_3$ and/or carbon.

Figure 19:
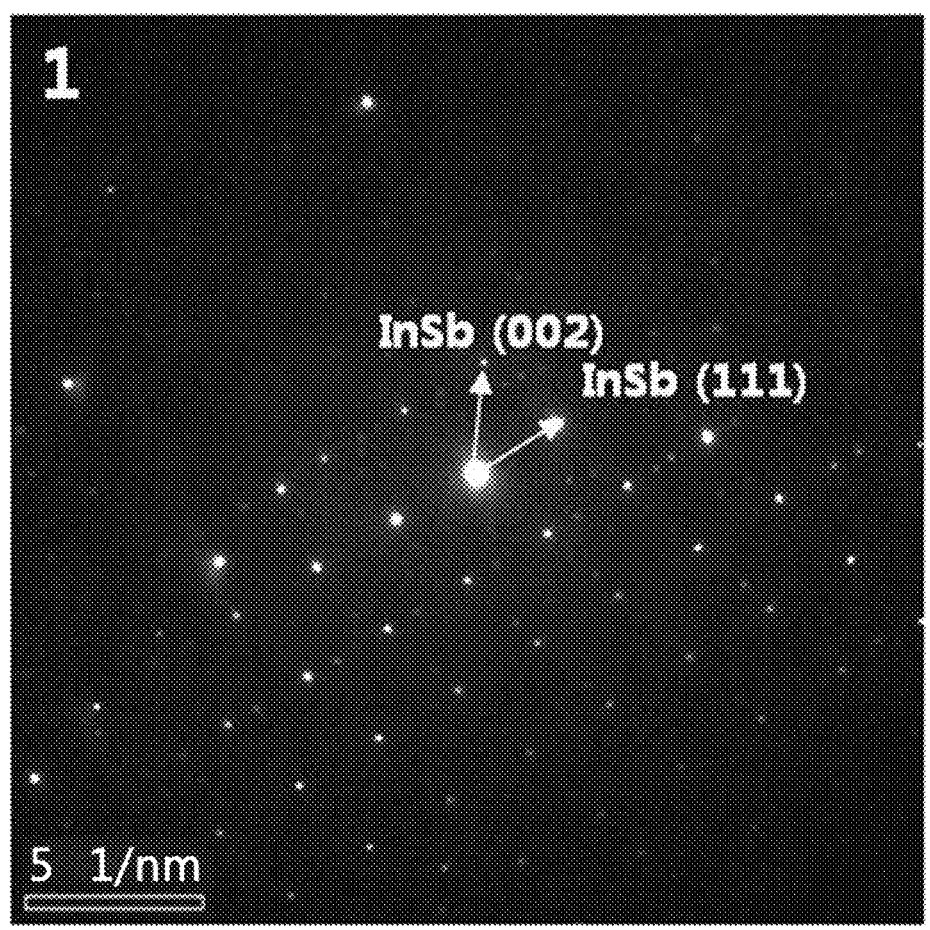
FIGS. 19 and 20 are images showing TEM diffraction patterns at different portions of the grain boundary for a sample according to the example of the present disclosure.
Figure 20:
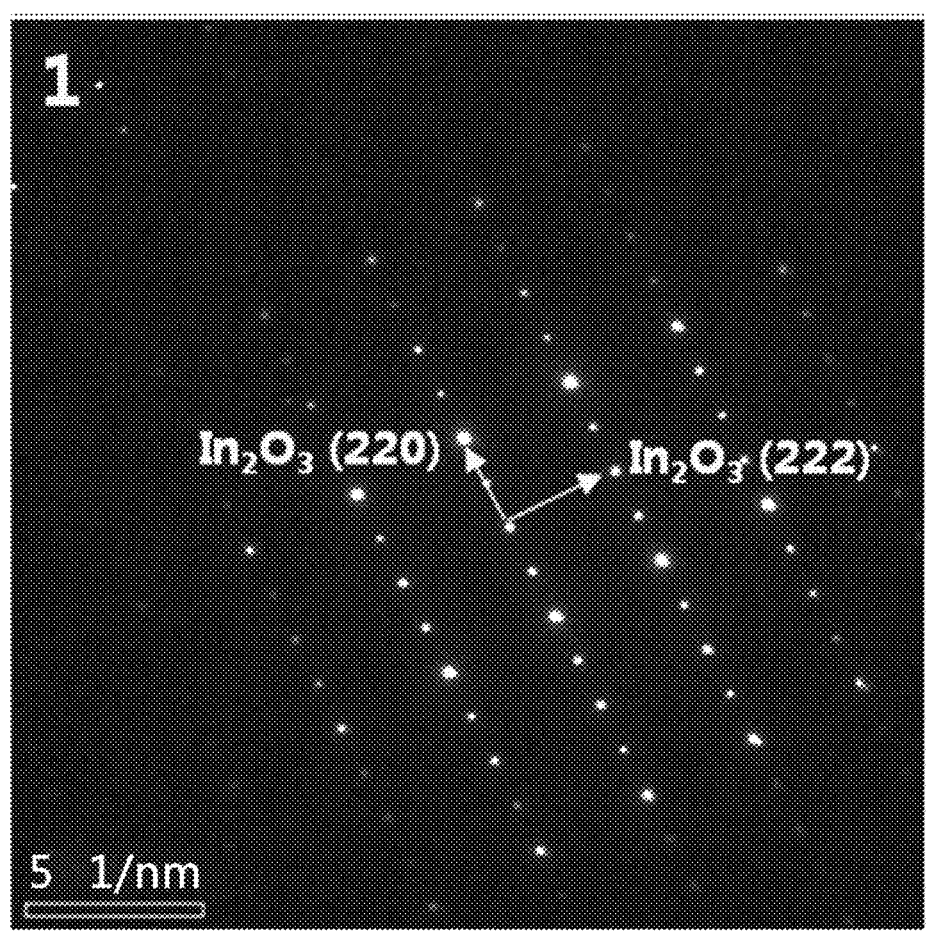

FIGS. 19 and 20 are images showing TEM diffraction patterns at different portions of the grain boundary for a sample according to the example of the present disclosure.

First, referring to the result of FIG. 19, it may be understood that in the case of the thermoelectric material according to the present disclosure, InSb may be included in the grain boundary. In addition, referring to the result of FIG. 20, it may be understood that in the case of the thermoelectric material according to the present disclosure, $In_2O_3$ may be included in the grain boundary.

Therefore, through the measurement results of FIGS. 19 and 20, it may be understood that in the case of the thermoelectric material according to the present disclosure, materials such as InSb and $In_2O_3$ may be additionally included at the boundary of the Skutterudite grains.

In particular, a material such as InSb is a major component of the material filled in the grain boundary, and may be included in a greater amount than that of the Ni-containing material. For example, in the grain boundary of the thermoelectric material according to the present disclosure, InSb may be filled in a film form as a main material, and a Ni-containing material may be included in InSb filled in a film form.

Meanwhile, seeing the EDS analysis results of FIG. 18, a C peak is observed, and from these results, it may be understood that the grain boundary of the thermoelectric material according to the present disclosure may include carbon.

Figure 15:
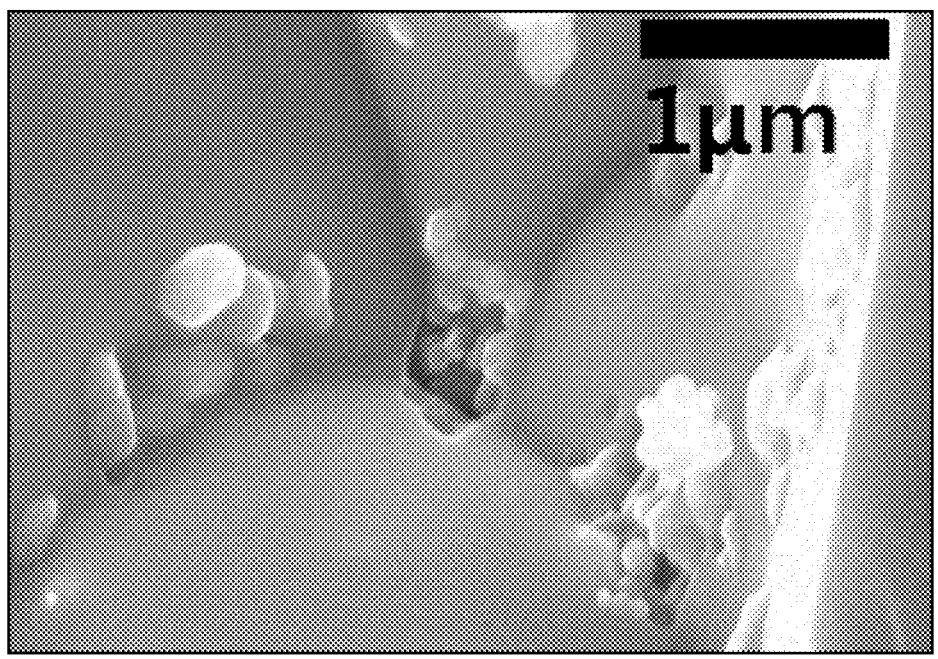
Figure 16:
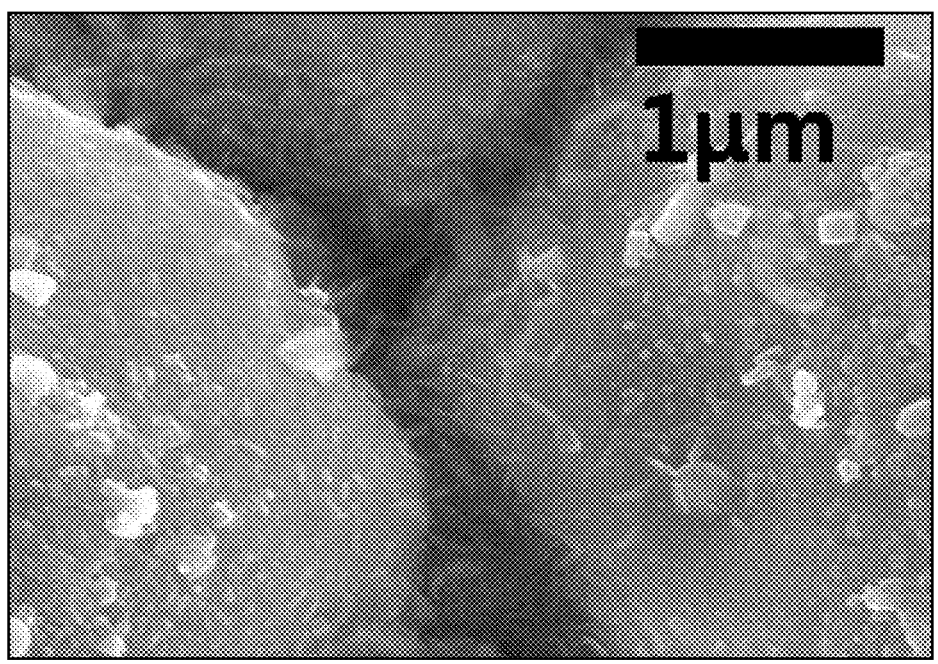

In addition, referring to FIGS. 14 and 15, the thermoelectric material according to the present disclosure is distinguishable from the Skutterudite grain, and may further include a plurality of fine grains with a smaller size. Here, the fine grains may be located at the interior of the grain or at grain boundary. The fine grains may have components such as InSb, $In_2O_3$, carbon or the like.

Figure 21:
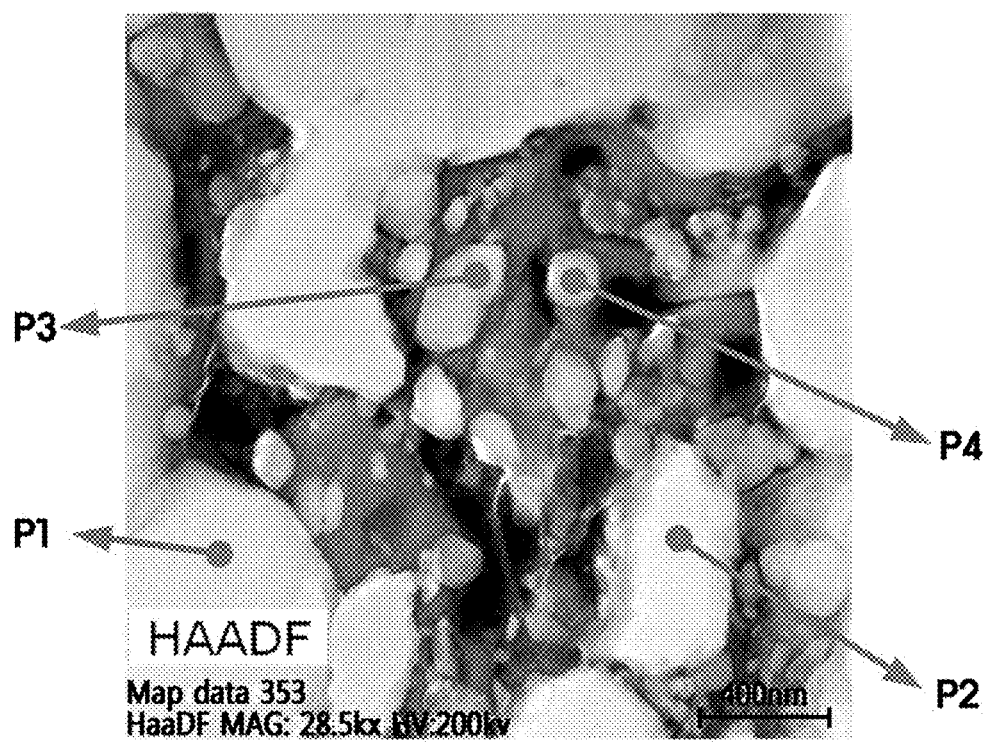
FIG. 21 is a scanning transmission electron microscope (STEM) image obtained by photographing a predetermined portion of the grain boundary for a sample according to the example of the present disclosure.
Figure 22:
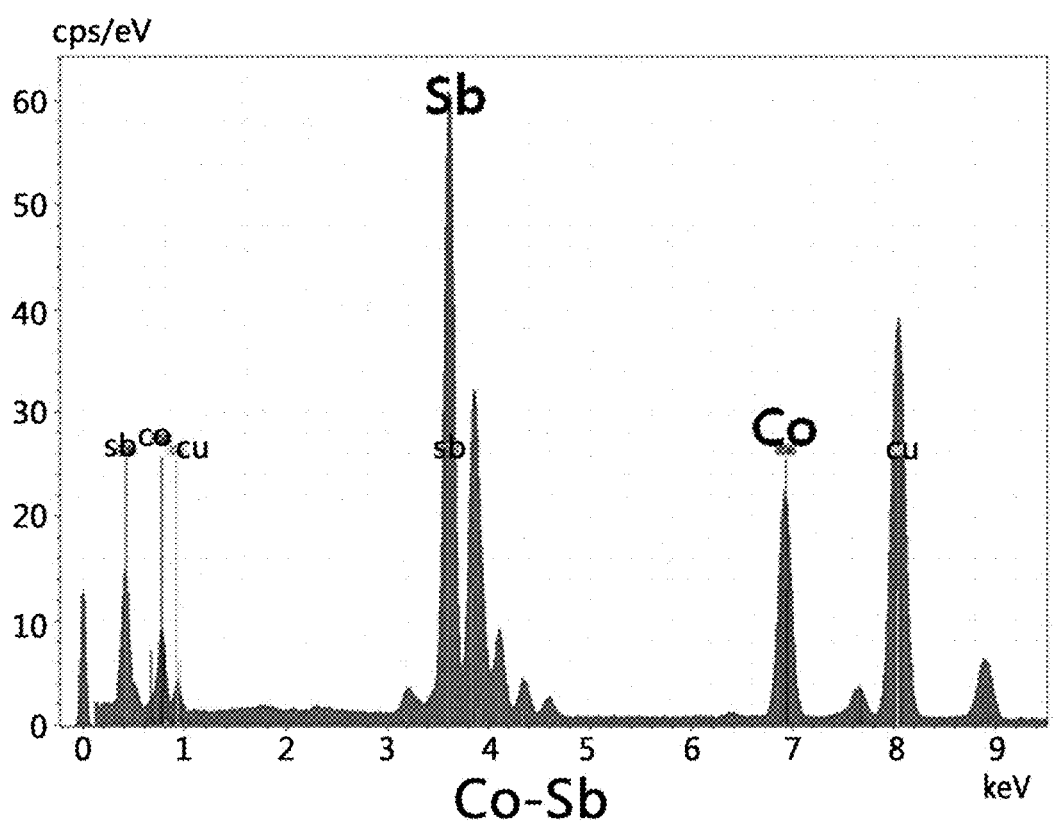
FIGS. 22 to 25 are graphs showing EDS analysis results for portions P1 to P4 of FIG. 21.
Figure 23:
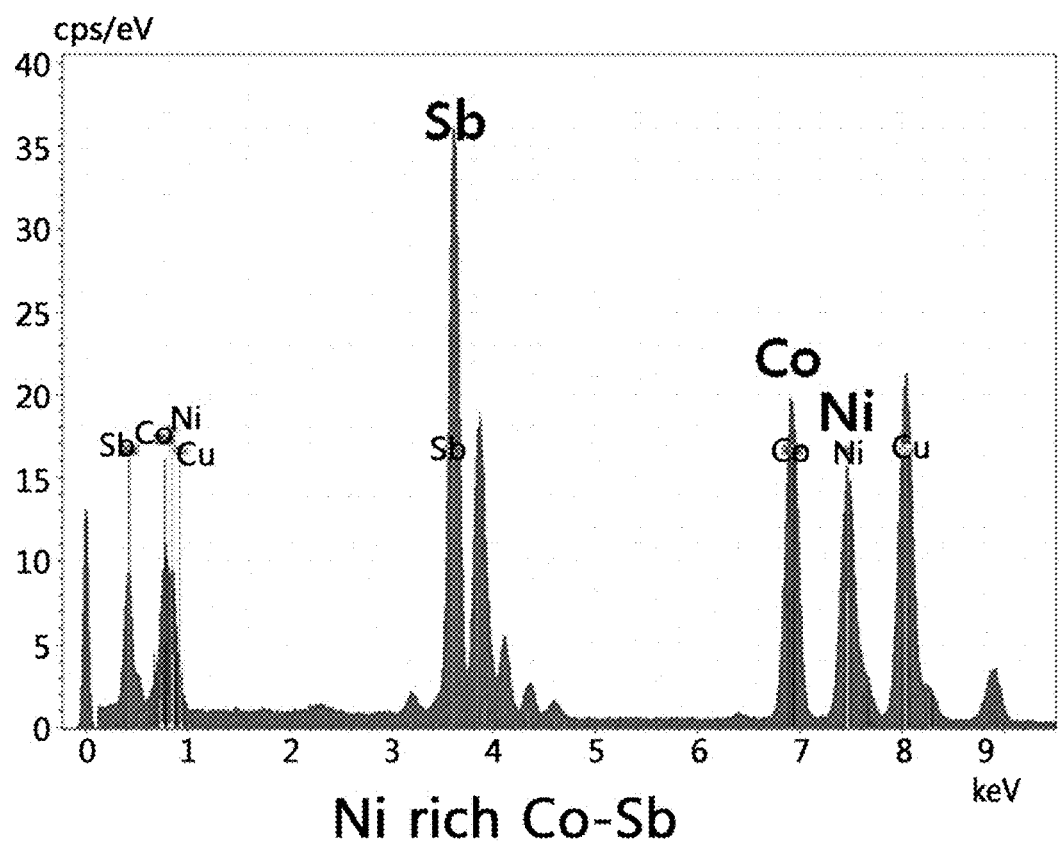
Figure 24:
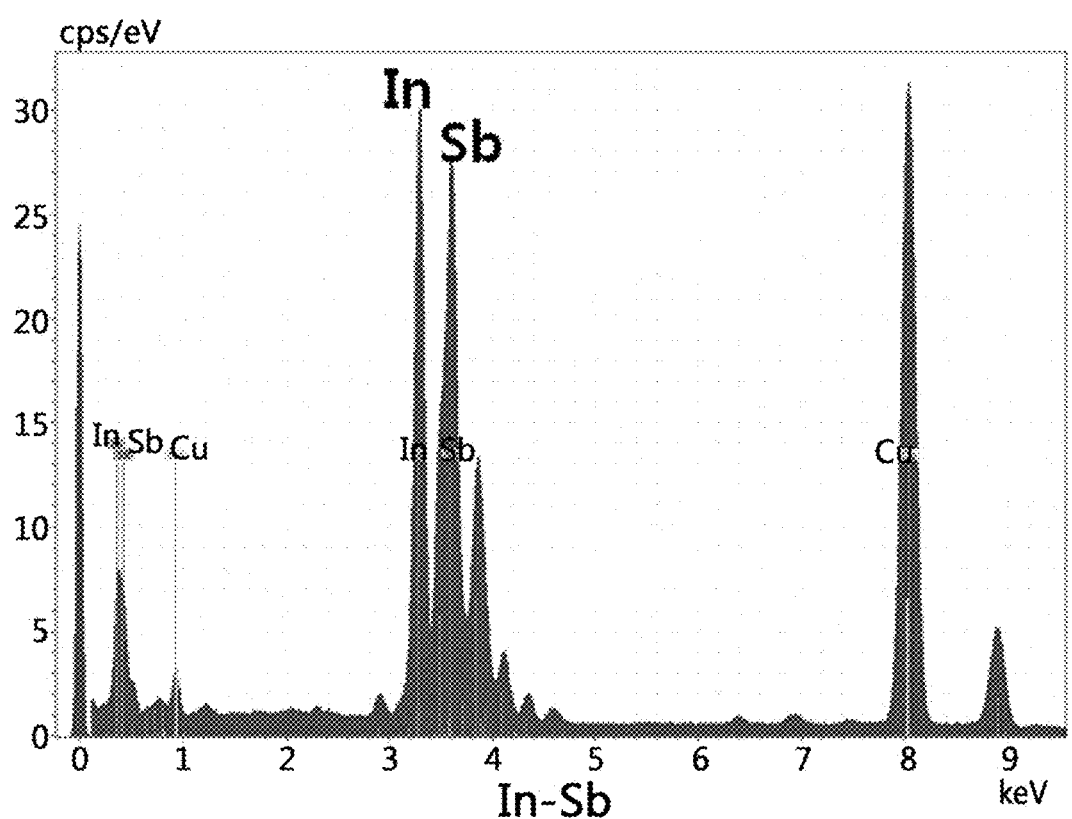
Figure 25:
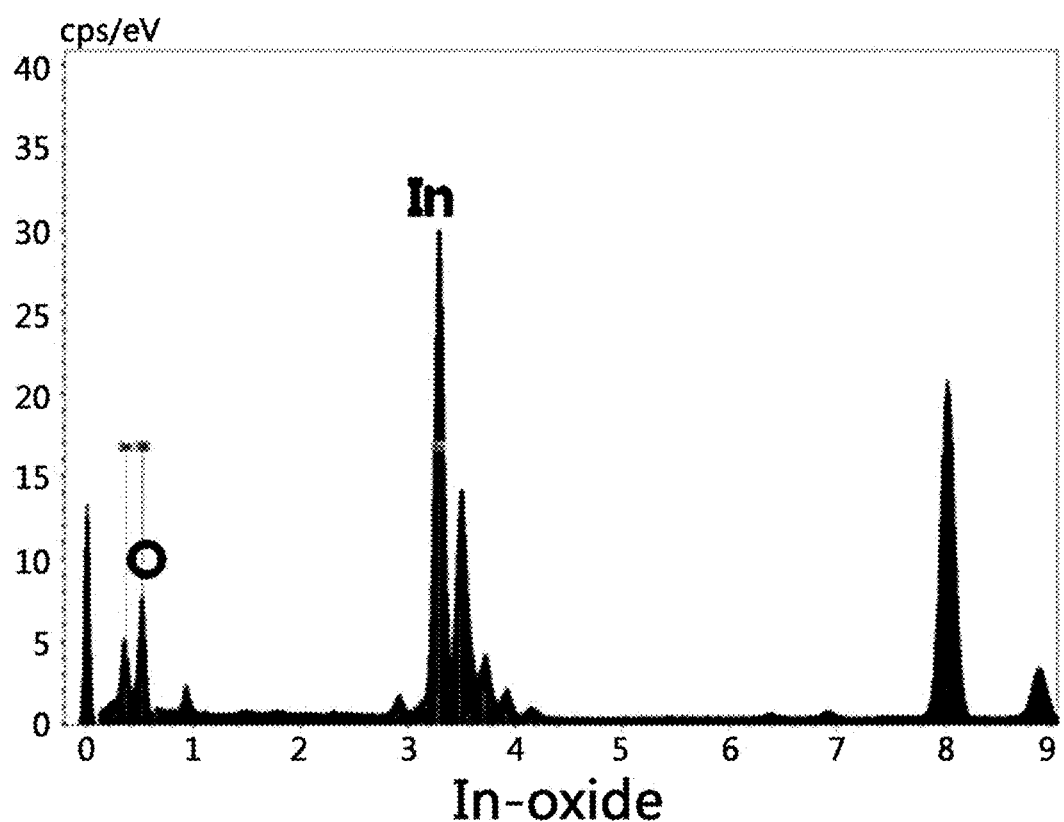

FIG. 21 is a scanning transmission electron microscope (STEM) image obtained by photographing a predetermined portion of the grain boundary for a sample according to the example of the present disclosure. In addition, FIGS. 22 to 25 are graphs showing EDS analysis results for portions P1 to P4 of FIG. 21.

First, referring to FIG. 21, it may be found that the thermoelectric material according to the present disclosure includes a plurality of grains like a portion indicated by P1. In addition, referring to FIG. 22, it may be found that this grain is a Skutterudite grain containing Co and Sb as main raw materials.

In addition, seeing the measurement results of FIG. 21, it may be understood that the thermoelectric material according to the present disclosure may include fine grains with a smaller size than the Skutterudite grains. In addition, the fine grains may be formed with various components and shapes, different from the Skutterudite grains. In more detail, seeing the measurement results of FIG. 23, the fine grains may include Ni rich Co—Sb particles. In addition, seeing the measurement results of FIG. 24, the fine grains may include In—Sb particles. In addition, seeing the measurement results of FIG. 25, the fine grains may contain In-oxide particles. In addition, seeing the measurement results of FIG. 21, it may be found that the fine grains are located at the grain boundary or the interior of the grains.

Figure 26:
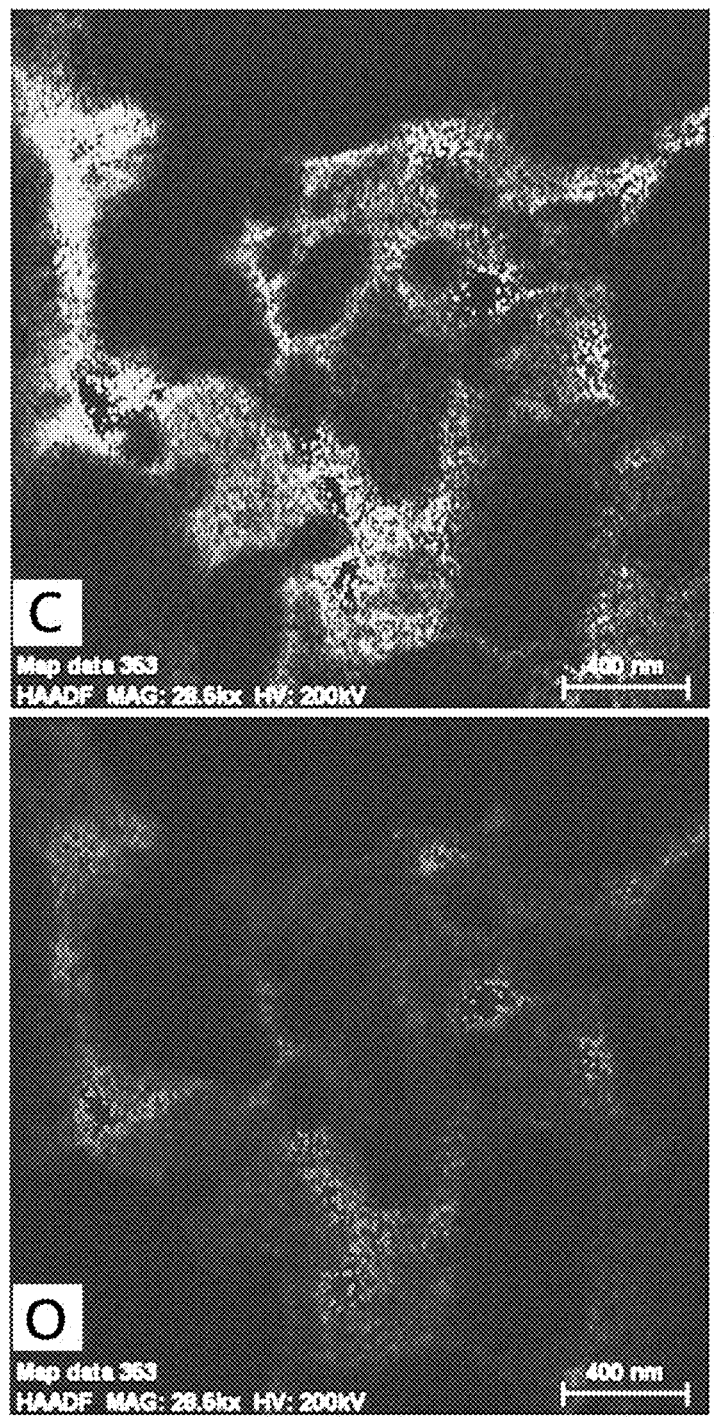
FIG. 26 is an STEM image showing EDS component mapping result for portions O and C in the region depicted in FIG. 21.

FIG. 26 is an STEM image showing EDS component mapping result for O and C in the region depicted in FIG. 21.

Referring to FIG. 26, the C components and the O components are distributed at the grain boundary, namely in the space between the Skutterudite grains. In particular, it may be found that the C components (marked with a bright blue color in the drawing) and the O components (marked with a bright red color in the drawing) are more distributed in a portion filled in a layer form rather than grains such as fine grains at the grain boundary. Therefore, according to these measurement results, it may be understood that the thermoelectric material according to the present disclosure may include O and C elements in the boundary of the Skutterudite grains.

Figure 27:
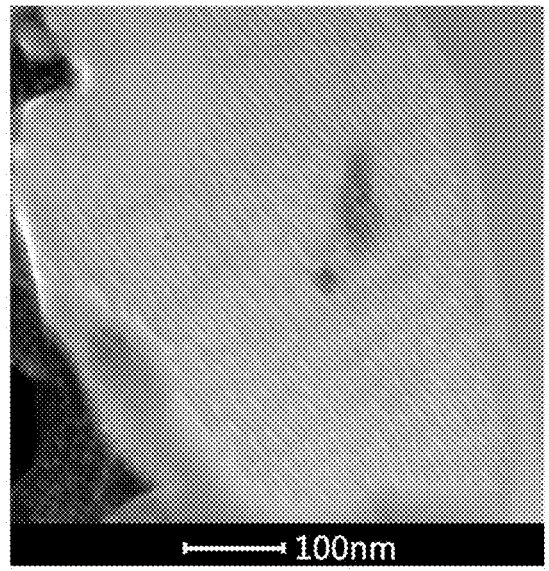
FIG. 27 is an STEM image showing a part of fine grans in the region depicted in FIG. 21.
Figure 27:
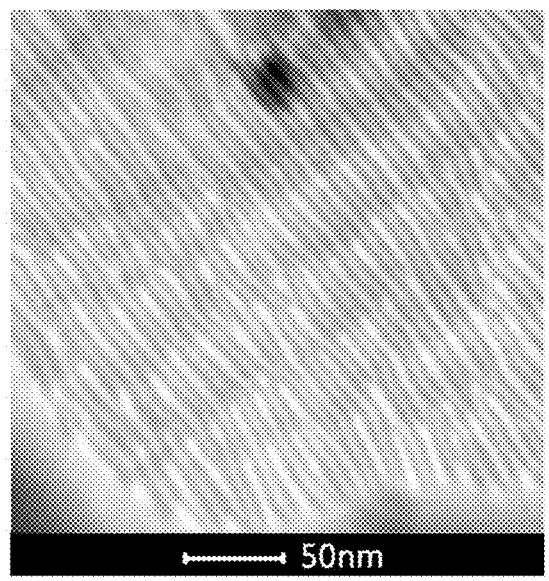
Figure 28:
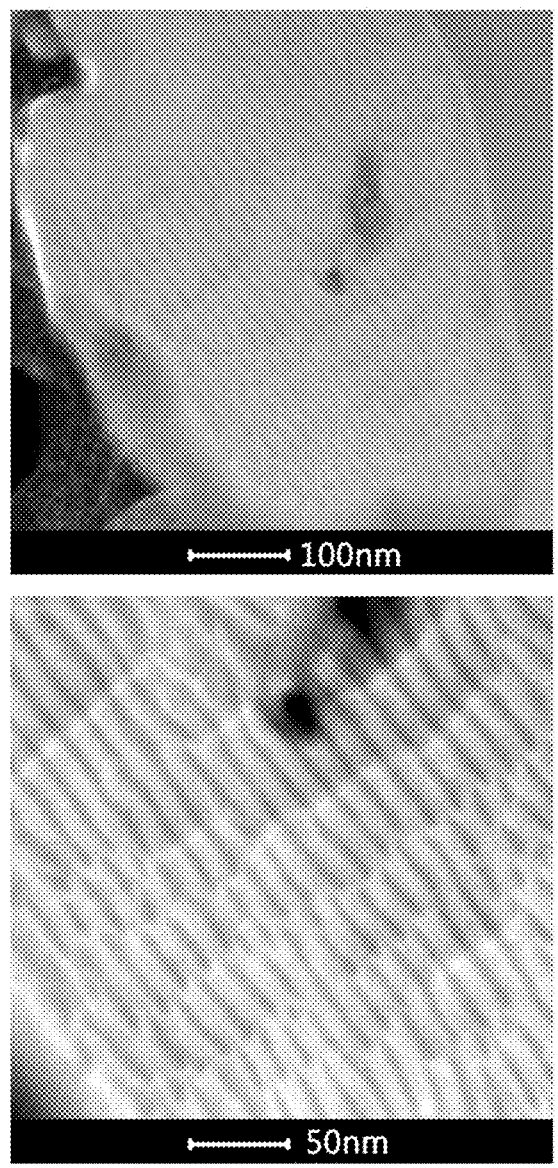
FIG. 28 is an STEM image showing the fine grain depicted in FIG. 27, with a different focus.

FIG. 27 is an STEM image showing a part of fine grans in the region depicted in FIG. 21. In addition, FIG. 28 is an STEM image showing the fine grain depicted in FIG. 27, with a different focus. In FIGS. 27 and 28, a lower video image is an enlarged view showing a predetermined portion of the upper video image.

Referring to FIGS. 27 and 28, it may be understood that the thermoelectric material according to the present disclosure may include fine grains, and the fine grains may be formed in a lamella structure in which a plurality of layers are laminated. For example, the fine grains as indicated by P2 in FIG. 21 may be formed to have a fine structure as shown in FIGS. 27 and 28.

Further, FIG. 28 shows a fine structure of a lamella shape, similar to FIG. 27, although the focus is was different from that of FIG. 27. Therefore, seeing the results of FIGS. 27 and 28, it may be understood that a lamella structure may be formed not only on the surface of the fine grains but also at the inside thereof.

Figure 29:
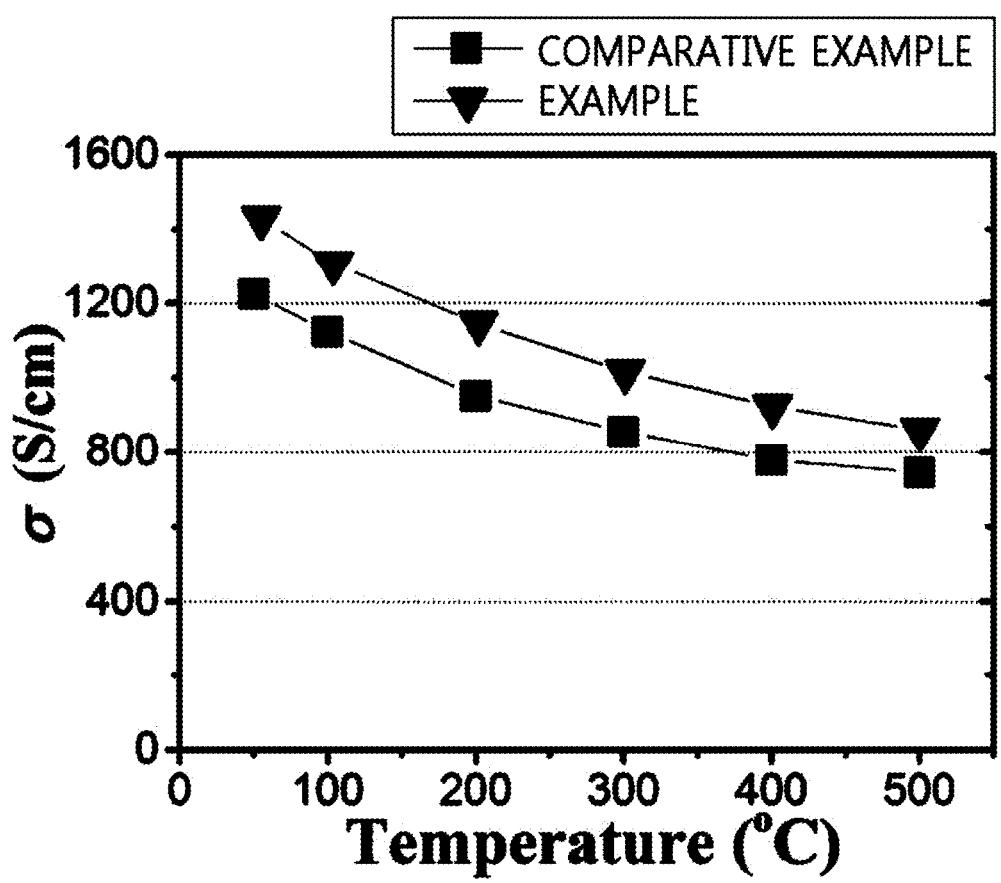
FIG. 29 is a graph comparatively showing electrical conductivity measurement results according to temperature of the thermoelectric material in the example of the present disclosure and the comparative example.

Meanwhile, electrical conductivity and Seebeck coefficient of the samples according to the example and the comparative example were measured at predetermined temperature intervals using ZEM-3 (Ulvac-Riko, Inc.), and the measurement results of the electrical conductivity are shown in FIG. 29 as the example and the comparative example.

Figure 30:
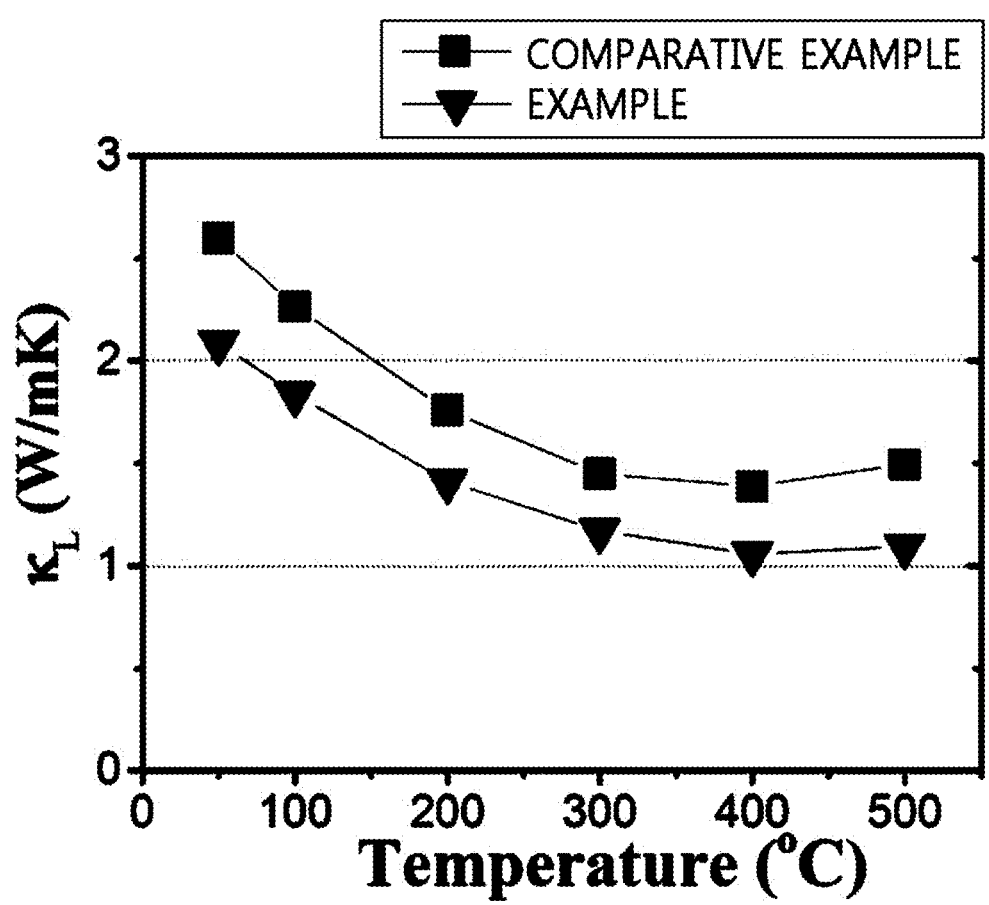
FIG. 30 is a graph comparatively showing lattice thermal conductivity measurement results according to temperature of the thermoelectric material in the example of the present disclosure and the comparative example.

In addition, the lattice thermal conductivity was calculated by measuring the thermal conductivity for the samples of the example and the comparative example, and the results are shown in FIG. 30 as the example and the comparative example. At this time, the lattice thermal conductivity was calculated using the Wiedemann-Franz law, and the Lorentz constant used was $2.45*10^{-8}$ [$W\Omega K^{-2}$]. In more detail, the lattice thermal conductivity may be calculated using a following equation.

$$\kappa_L = \kappa_{total} - \kappa_e$$

Here, $\kappa_L$ represents lattice thermal conductivity, $\kappa_{total}$ represents thermal conductivity, and $\kappa_e$ represents thermal conductivity by electrical conductivity. In addition, $\kappa_e$ may be expressed as follows.

$$\kappa_e = \sigma LT$$

Here, $\sigma$ means electrical conductivity, L is a Lorentz constant, which is $2.45*10^{-8}$ [$W\Omega K^{-2}$]. In addition, T means temperature (K).

At this time, the thermal conductivity of each sample was measured at predetermined temperature intervals using LFA457 (Netzsch).

Figure 31:
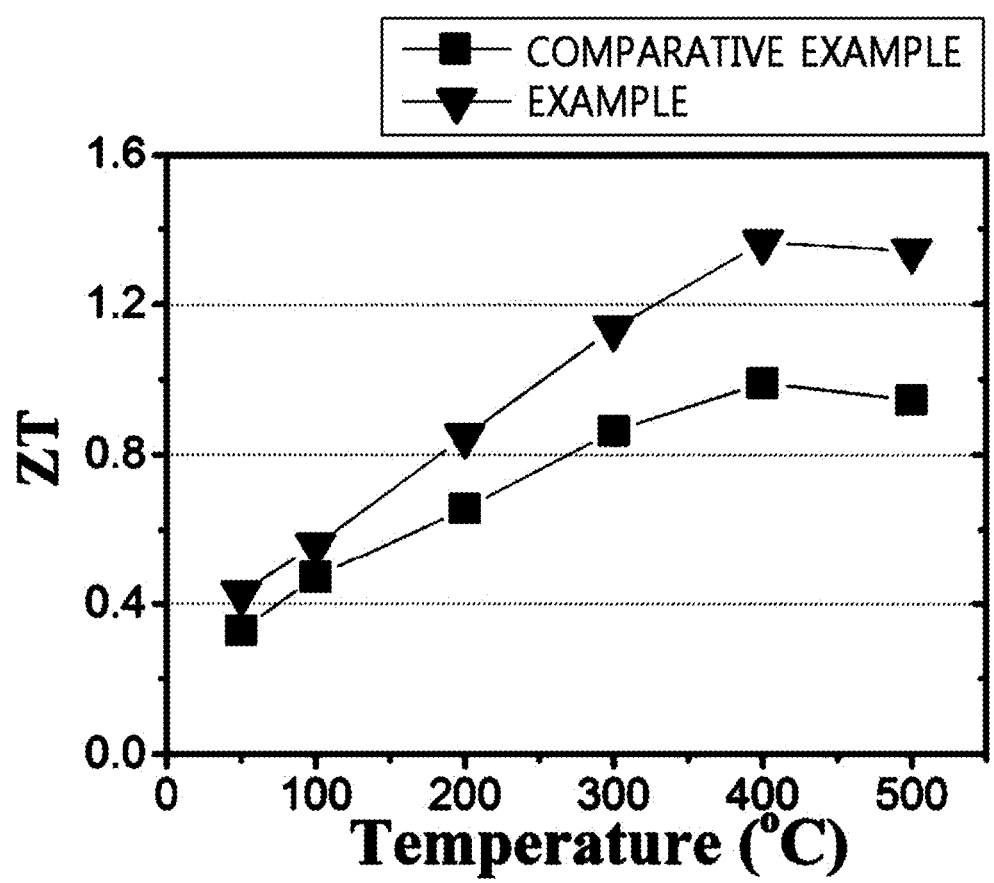
FIG. 31 is a graph showing ZT value measurement results according to temperature of the thermoelectric material in the example of the present disclosure and the comparative example.

In addition, the ZT value is calculated using the values measured as above, and the results are shown in FIG. 31 as the example and the comparative example.

First, seeing the results of FIG. 29, it may be found that in the thermoelectric material according to the example in which InSb is included in the grain boundary of the $CoSb_3$ matrix and the Ni-containing material is included in the form of a secondary phase in the inter-boundary, the electrical conductivity is significantly higher over the entire measurement range of 50° C. to 500° C. in comparison to the thermoelectric material of the comparative example in which a Ni-containing material is not included in the grain boundary.

In addition, seeing the results of FIG. 30, it may be found that the lattice thermal conductivity of the thermoelectric material of the example is significantly lower than that of the thermoelectric material of the comparative example over the entire measurement range of 50° C. to 500° C.

In addition, seeing the ZT value of each sample with reference to the results of FIG. 31, it may be found that the ZT value of the thermoelectric material of the example according to the present disclosure is significantly higher than that of the thermoelectric material of the comparative example. Further, it may be understood that the high ZT value is more prominent as the temperature gradually increases from 50° C. to 500° C.

In particular, the thermoelectric material of the comparative example exhibits a ZT value of less than 0.7 at 200° C., but the thermoelectric material of the example exhibits a ZT value of greater than 0.8 at the same temperature. In addition, the thermoelectric material of the comparative example shows a ZT value of less than 0.9 at 300° C., but the thermoelectric material of the example shows a ZT value of greater than 1.1 at the same temperature. In addition, the thermoelectric material of the comparative example exhibits a ZT value of 1.0 or below at 400° C. and 500° C., but the thermoelectric material of the example exhibits a ZT value of greater than 1.3 at the same temperature.

According to the above results, it may be understood that the thermoelectric material according to the present disclosure including a Ni-containing material at the grain boundary has higher electrical conductivity, lower lattice thermal conductivity and significantly increased ZT value over the entire temperature range of 50° C. to 500° in comparison to the existing thermoelectric material. Therefore, the thermoelectric material according to the present disclosure has excellent thermoelectric conversion performance and thus may be very usefully utilized as a thermoelectric conversion material.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

What is claimed is:

1. Thermoelectric powder, comprising:
  a core portion having one or more Skutterudite particles; and
  a coating portion having a Ni-containing material and coated on at least a part of a surface of the core portion, wherein,
  the Ni-containing material includes at least one of a Ni single substance and a Ni compound,
  the Ni compound includes at least one of In, Sb and Co, along with Ni, and
  the Ni compound includes $Ni_{1-x}Co_xSb$, where x satisfies $0<x<1$.

2. The thermoelectric powder according to claim 1, wherein the coating portion further includes at least one of In, Sb, Co, O, C and Cl, or a compound thereof other than the Ni-containing material.

3. The thermoelectric powder according to claim 2, wherein the coating portion includes at least one of InSb, $In_2O_3$ and carbon.

4. The thermoelectric powder according to claim 1, wherein the core portion has an average particle size of 1 nanometer to 100 micrometer, and
  wherein the coating portion has a thickness of 0.1 nanometer to 10 micrometer.

5. The thermoelectric powder according to claim 1, further comprising:
  fine particles having a particle size smaller than the particles of the core portion.

6. The thermoelectric powder according to claim 5, wherein the fine particles include at least one of Ni, In, Sb, Co, O, C and Cl, or a compound thereof.

7. The thermoelectric powder according to claim 1, wherein the core portion or the coating portion further includes a pore therein.

8. A thermoelectric conversion element, comprising the thermoelectric material defined in claim 1.

9. A thermoelectric power generation apparatus, comprising the thermoelectric material defined in claim 1.

10. A thermoelectric material, comprising:
  a plurality of Skutterudite grains including at least one kind of Skutterudite material; and
  a Ni-containing material located at a grain boundary between the plurality of Skutterudite grains, wherein the Ni-containing material includes $Ni_{1-x}Co_xSb$, where, x satisfies $0<x<1$.

11. The thermoelectric material according to claim 10, wherein at least one of InSb, $In_2O_3$ and carbon is located at the grain boundary.

12. The thermoelectric material according to claim 10, further comprising:
  fine grains located in at least one of a surface, an interior and a boundary of the Skutterudite grain, having a smaller size than the Skutterudite grain, and including at least one of Ni, In, Sb, Co, O, C and Cl, or a compound thereof.

13. The thermoelectric material according to claim 12, wherein the fine grains are formed in a lamella structure.

* * * * *